United States Patent
Sato et al.

(10) Patent No.: US 7,679,104 B2
(45) Date of Patent: Mar. 16, 2010

(54) VERTICAL TYPE SEMICONDUCTOR DEVICE AND MANUFACTURING METHOD OF THE DEVICE

(75) Inventors: Yoshihiro Sato, Tokyo (JP); Sadahiro Kato, Tokyo (JP); Masayuki Iwami, Tokyo (JP); Hitoshi Sasaki, Tokyo (JP); Shinya Ootomo, Tokyo (JP); Yuki Niiyama, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 153 days.

(21) Appl. No.: 11/937,090

(22) Filed: Nov. 8, 2007

(65) Prior Publication Data

US 2008/0142837 A1    Jun. 19, 2008

(30) Foreign Application Priority Data

Nov. 9, 2006   (JP)   ............................. 2006-304193
Nov. 10, 2006  (JP)   ............................. 2006-305869
Mar. 23, 2007  (JP)   ............................. 2007-077580

(51) Int. Cl.
*H01L 29/267*    (2006.01)

(52) U.S. Cl. .................. 257/190; 257/471; 257/472; 257/E21.112; 438/507; 438/92; 438/534

(58) Field of Classification Search ............... 257/190, 257/471–473, E29.081, E21.112; 438/92, 438/507, 534, 570
See application file for complete search history.

(56) References Cited

U.S. PATENT DOCUMENTS

| | | | |
|---|---|---|---|
| 7,276,423 B2 * | 10/2007 | Beach et al. ................. | 438/401 |
| 7,439,595 B2 * | 10/2008 | Ueda ........................... | 257/401 |
| 2003/0098462 A1 | 5/2003 | Yoshida | |
| 2005/0116243 A1 * | 6/2005 | Mochida ........................ | 257/98 |
| 2006/0046331 A1 | 3/2006 | Kiyama et al. | |
| 2006/0108659 A1 | 5/2006 | Yanagihara et al. | |
| 2006/0145283 A1 * | 7/2006 | Zhu et al. .................... | 257/472 |
| 2006/0261356 A1 * | 11/2006 | Iwakami et al. ............... | 257/80 |
| 2009/0121775 A1 * | 5/2009 | Ueda et al. .................. | 327/427 |

FOREIGN PATENT DOCUMENTS

| | | |
|---|---|---|
| JP | 2003-60212 | 2/2003 |
| JP | 2004-31896 | 1/2004 |
| JP | 2006-100801 | 4/2006 |
| JP | 2006-156457 | 6/2006 |
| JP | 2006-310408 | 11/2006 |

OTHER PUBLICATIONS

U.S. Appl. No. 12/422,111, filed Apr. 10, 2009, Sato, et al.

* cited by examiner

*Primary Examiner*—Thinh T Nguyen
(74) *Attorney, Agent, or Firm*—Oblon, Spivak, McClelland, Maier & Neustadt, L.L.P.

(57) ABSTRACT

A vertical semiconductor element comprises: an electro-conductive substrate; a GaN layer, as a nitride compound semiconductor layer, which is selectively grown as a convex shape on one surface of the electro-conductive substrate through a buffer layer; a source electrode as a first electrode formed on the GaN layer; and a drain electrode as a second electrode formed on another surface of the electro-conductive substrate.

10 Claims, 19 Drawing Sheets

(a)

(b)

(c)

(d)

(e)

(a)

(b)

(a)

(b)

(c)

(d)

(a)

(b)

(c)

(d)

(a)

(b)

(c)

(d)

(e)

(a)

(b)

(c)

(d)

(a)

(b)

(c)

(d)

(a)

(b)

(c)

(d)

(a)

(b)

(c)

(d)

(a)

(b)

(c)

VERTICAL TYPE SEMICONDUCTOR DEVICE AND MANUFACTURING METHOD OF THE DEVICE

BACKGROUND OF THE INVENTION

1. Technical Field

The present invention relates to a semiconductor element, and more specifically to a vertical semiconductor element, such as a power diode, a power MOSFET and the like using a nitride compound semiconductor, and a method of manufacturing a vertical semiconductor element.

2. Related Arts

As semiconductor power device elements, there are such as a pn diode, a Schottky diode, a power MOSFET, an insulated gate bipolar transistor (IGBT), and the like. For example, regarding a performance required for the Schottky diode, for a forward current direction, a resistance is preferred to be as small as possible, and for a reverse current direction, the resistance is preferred to be as high as possible.

A nitride compound semiconductor represented by a GaN has a high-breakdown voltage, a preferable electron transport property and a preferable thermal conductivity, comparing to silicon. Therefore, it is expected for applying to a semiconductor power device using a nitride compound semiconductor, such as GaN or the like.

Furthermore, in the power device using the nitride compound semiconductor, an n-type layer is able to be thinner for obtaining the same breakdown voltage, comparing to the power device using a silicon. Thereby, the forward resistance becomes possible to be smaller.

For such nitride compound semiconductor power devices, there is disclosed a Schottky barrier diode in JP 2003-60212 (a published Japanese patent application: hereinafter, it is called as a document 1), which comprises a buffer layer formed by disposing an AlN layer and a GaN layer one after the other on a substrate of silicon, a GaN layer formed thereon, and an electrode formed on the GaN layer, which has a Schottky contact therewith.

Moreover, there is disclosed a Schottky barrier diode in JP 2004-031896 (hereinafter, it is called as a document 2), which comprises an n$^+$-type GaN layer and an n-type GaN layer formed in order on a sapphire substrate, through a GaN buffer layer, a convex part formed by patterning the n-type GaN layer, and an AlGaN layer grown at both left and right sides of the convex part, and a two-dimensional electron gas is formed at a heterojunction area between the AlGaN layer and the n-type GaN layer. In this case, an anode electrode is connected to the convex part, and a cathode electrode is formed on the flat n$^+$-type GaN layer at a side of the convex part.

Moreover, there is disclosed a Schottky barrier diode in JP 2006-156457 (hereinafter, it is called as a document 3), which comprises a GaN layer and an AlGaN layer formed in order on a silicon substrate, a Schottky electrode formed on the AlGaN layer, and a via formed through the AlGaN layer and the GaN layer to reach the silicon substrate, and an ohmic electrode, of which one part is implanted in the via.

Moreover, there is disclosed an epitaxial substrate in JP 2006-100801 (hereinafter, it is as a document 4), which comprises a GaN epitaxial film layer, of which thickness is more than or equal to 5 μm and less than or equal to 1000 μm, on a GaN substrate having a predetermined carrier density.

Moreover, there is disclosed a semiconductor element in JP 2006-310408 (hereinafter, it is described as a document 5), which comprises a GaN substrate having an electro-conductivity, a GaN region formed on the GaN substrate, and a Shottky electrode having a Schottky junction in the GaN region.

According to the Schottky barrier diode described in the above mentioned document 1, as the AlN layer exists in a current path, an on-resistance becomes high.

Moreover, according to the Schottky barrier diode disclosed in the above document 2, the on-resistance becomes lower by the two-dimensional electron gas. However, as the Schottky barrier diode is a flat type device in which the anode electrode and the cathode electrode are disposed laterally, an element area of the diode becomes large. Furthermore, when a distance between the anode electrode and the cathode electrode is expanded, a withstand voltage is able to be ensured, while the on-resistance increases.

On the contrary, according to the Schottky barrier diode disclosed in the above mentioned document 3, using the two-dimensional electron gas formed at the heterojunction between the GaN layer and the AlGaN layer, the current is flowed laterally. Hence, as similar to the element according to the document 2, the increase of the on-resistance is able to be suppressed.

However, according to the Schottky barrier diode, as similar to the document 2, for improving the withstand voltage, the on-resistance becomes also high. Moreover, as both the ohmic electrode and the Schottky electrode are formed on the same surface, substantially the element area of the diode is not able to be smaller.

Therefore, regarding a Schottky barrier diode, it is preferable to adopt a structure in which the Shottky electrode and the ohmic electrode are substantially arranged in vertical direction. However, as disclosed in the document 1, the thickness of the GaN material formed on the silicon substrate is approximately 850 nm at most, even including the buffer layer. Hence, the withstand voltage becomes hard to be improved. For example, for manufacturing a device having a breakdown voltage of approximately 1200 (V) for electric vehicles, the GaN layer becomes necessary to be a thickness of approximately 10 μm.

On the contrary, a thick formed GaN substrate may be used, however, such a thick substrate is expensive. And then a device using the GaN substrate having a thickness of approximate 10 μm is hard to be popularized at a low price.

Moreover, according to the Schottky barrier diode disclosed in the above mentioned document 2, because of the two-dimensional electron gas, the on-resistance (a series resistance in operation) becomes lower. However, as the Schottky barrier diode is a lateral type device in which the current is flowed laterally, the element area of the device becomes large. Furthermore, when the distance between the anode electrode and the cathode electrode are expanded, the withstand voltage is able to be ensured, while the on-resistance increases.

Therefore, regarding the Schottky barrier diode, for combining the high breakdown voltage with the low on-resistance, it is preferable to adopt a vertical type device in which the Shottky electrode and the ohmic electrode are substantially vertically arranged and the current is flowed vertically. However, the sapphire substrate is not able to be applied to the vertical type device, due to the nonconductive property.

On the contrary, the Schottky barrier diode disclosed in the document 1 is a vertical type device using a silicon substrate, while it has the following problems.

1. Due to the existence of the buffer layer including the AlN layer between the silicon substrate and the GaN layer, a semiconductor layer having a wide band gap exists in the current path. Hence, the series resistance becomes high.

For avoiding such the problem, it can be considered to form the buffer layer thinner. However, because the AlN and the AlGaN are wide band gap semiconductors as close to insulators, even when the buffer layer is formed thinner, there is a limit for lowering the resistance.

2. For example, in order to manufacture a high withstand device having a breakdown voltage of approximately 1200 (V) for electric vehicles, GaN layer as a carrier moving layer is necessary to be a thickness of approximately 10 μm. However, the thickness of the GaN layer disclosed in the document 2 is 850 nm at most, even including the buffer layer. Therefore, it is not sufficient to improve the withstand voltage.

3. It is considered that the withstand voltage is able to be increased without increasing the on-resistance, by forming the GaN layer simply thicker. However, as there is a difference between the GaN and the silicon on a coefficient of thermal expansion and a lattice constant, a thick GaN layer having few crystal defects is hard to be grown on the silicon substrate. Moreover, a crack may be occurred on the GaN layer, or a bending or a cracking may be occurred on the silicon substrate. Therefore, these become cause on a device characteristic getting deteriorated and on a yield getting decreased.

Corresponding to the above mentioned problems of 2 and 3, according to the above mentioned document 4 and 5, the electro-conductive GaN layer is adopted. Hence, the energizing in the vertical direction becomes possible. Moreover, thick GaN layer having few crystal defects is able to be epitaxially grown. However, the GaN substrate itself is quite expensive, comparing to such as the silicon substrate or the like. And then as a manufactured product, it is not practical.

Furthermore, the Shottky barrier diode is widely used as a switching power source. And then the high breakdown voltage and the low on-resistance are required therefor. Regarding the conventional Schottky barrier diode using a silicon (Si) material, for realizing the high breakdown voltage, not only a drift layer, in which a depletion layer becomes expanded under a reverse bias, is necessary to be thicker, but also a carrier density is necessary to be low. However, for realizing the decreasing of the on-resistance, under a forward bias, not only the drift layer, in which electrons pass through, is necessary to be thinner, and also the carrier density is necessary to be high. Therefore, in the Schottky barrier diode using Si-based materials, it is difficult to realize both of the high breakdown voltage and the low on-resistance together.

Here, as a gallium nitride (GaN) semiconductor has a high breakdown voltage, even at the time of forming the drift layer thinner, a high withstand voltage is able to be obtained. Therefore, in recent years, for a Schottky barrier diode to be able to realize both of the high withstand voltage and the low on-resistance, the Schottky barrier diode using GaN semiconductor has attracted attention.

For the Schottky barrier diode using such the GaN semiconductor, a Schottky burrier diode 310 shown in FIG. 21 is disclosed in the above mentioned document 1. The Schottky burrier diode 310 comprises a buffer layer 303 formed using an aluminum nitride (AlN) or a Gallium nitride (GaN) on a Si substrate 304, a GaN drift layer 302 formed using a GaN semiconductor, a Schottky (an anode) electrode 301, and an ohmic (a cathode) electrode 305 formed on the other side of the Si substrate 304. In the Schottky barrier diode 310, when a reverse bias is applied, a depletion layer becomes expanded in the GaN drift layer 302. Thus, a high breakdown voltage becomes possible to be realized. Furthermore, when a forward bias is applied, electrons are flowed from the ohmic electrode 305 through the GaN drift layer 302 to the Schottky electrode 301.

Moreover, for the Schottky barrier diode using such the GaN semiconductor, a Schottky burrier diode 410 shown in FIG. 22 is disclosed in the above mentioned document 3. The Schottky burrier diode 410 comprises a buffer layer 403 formed using an AlN on a Si substrate 402, a first semiconductor layer 404 formed using a GaN semiconductor, a second semiconductor layer 405 formed using an aluminum gallium nitride (AlGaN), a Schottky electrode 406, and a rear electrode 401 formed on the other side of the Si substrate 402. Furthermore, the Schottky barrier diode 410 comprises an ohmic electrode 407 formed on the same surface as the Schottky electrode 406 and in a via 408 which passes through the first semiconductor layer 404 and the buffer layer 403 to reach the Si substrate 402.

In the Schottky barrier diode 410, when a forward bias is applied, a current is flowed from the Schottky electrode 406 to the ohmic electrode 407, because of a two-dimensional electron gas formed at an interface between the first semiconductor layer 404 and the second semiconductor layer 405. And then, the current is flowed from the ohmic electrode 407 through the via 408 and the Si substrate 402 to the rear electrode 401. Moreover, when a reverse bias is applied between the Schottky electrode 406 and the rear electrode 401, a depletion layer becomes expanded in a region under the Schottky electrode 406 and between the first semiconductor layer 404 and the second semiconductor layer 405. Hence, the current is not flowed between the Schottky electrode 406 and the rear electrode 401. Thus, the high withstand voltage becomes possible to be realized.

However, in the conventional Schottky barrier diode 310, for relaxing a strain caused by a difference of lattice constants or coefficients of thermal expansion between the Si substrate and GaN, the buffer layer 303 including the AlN layer is formed. However, as the AlN layer includes plenty of defects and has a high resistance, a sufficient current is not able to be flowed in the vertical direction in FIG. 21. Hence, the on-resistance of the Schottky barrier diode 310 is not able to be lowered.

Moreover, in the conventional Schottky barrier diode 410, as both of the Schottky electrode 406 and the ohmic electrode 407 are formed on the same surface, a chip size becomes large corresponding to an area of the ohmic electrode 407. Furthermore, in the Schottky barrier diode 410, a withstand voltage is determined based on a distance between the Schottky electrode 406 and the ohmic electrode 407. Therefore, in the Schottky barrier diode 410, for obtaining a Schottky barrier diode of a high withstand voltage, the distance between the Schottky electrode 406 and the ohmic electrode 407 is necessary to be long. Hence, the chip size becomes larger.

BRIEF SUMMARY OF THE INVENTION

A first object of the present invention is to provide a vertical semiconductor element and a method of manufacturing the element, being able to improve a withstand voltage, using a thick nitride compound semiconductor layer, which is more available than the conventional.

A second object of the present invention is to provide a vertical semiconductor element of a low on-resistance and a method of manufacturing the element.

A third object of the present invention is to provide a vertical semiconductor element being able to obtain both a high withstand voltage and a low on-resistance, with the low cost, and a method of manufacturing the element.

A fourth object of the present invention is to provide a vertical semiconductor element which has a low on-resistance and a small chip size, and a method of manufacturing the element.

A vertical semiconductor element according to a first aspect of the present invention comprises: an electro-conductive substrate; a buffer layer grown on an one surface of the electro-conductive substrate; a nitride compound semiconductor layer which is selectively grown as convex shape on the buffer layer; a first electrode formed on the nitride compound semiconductor layer; and a second electrode formed on an another surface of the electro-conductive substrate.

According to the aspect, the nitride compound semiconductor layer which is selectively grown as convex shape on the substrate is used as a carrier layer and a semiconductor element is structured thereby. Therefore, in a narrow region on the substrate, the nitride compound semiconductor layer is isolated and formed. Thereby, a crack is prevented from being occurred, with suppressing an affect from the difference of the coefficient of thermal expansion from that of the substrate, in the convex shaped nitride compound semiconductor layer. Moreover, a Schottky barrier diode, a power MOSFET, or the like, which is formed on the nitride compound semiconductor layer, becomes possible to be formed with high yield. Furthermore, the nitride compound semiconductor layer is able to be formed as thick as approximately 10 μm or more for example. And then the withstand voltage becomes possible to be improved.

The vertical semiconductor element according to a second aspect of the present invention, further comprises: a bypass part which connects electrically a part of the one surface of the electro-conductive substrate where the nitride compound semiconductor layer is not formed, and at least one part of the nitride compound semiconductor layer.

According to the aspect, at least one part of an exposed part on the electro-conductive substrate surface is electrically connected with at least one part of the one side of the nitride compound semiconductor layer as a carrier moving layer. And, the bypass part exists through which at least one part of a current is flowed in a vertical direction between the first electrode and the second electrode Hence, at least one part of the current can be flowed from the first electrode on the nitride compound semiconductor layer, through the nitride compound semiconductor layer, the bypass part and the electro-conductive substrate, to the second electrode on the back surface of the substrate. Thus, the current amount flowed through the buffer layer becomes possible to be reduced. Therefore, in the vertical semiconductor element having the buffer layer as the wide band gap semiconductor, the on-resistance becomes possible to be reduced.

Moreover, the nitride compound semiconductor layer which is selectively grown as convex shape on the substrate is used as a carrier layer and a semiconductor element is structured thereby. That is to say, in a narrow region on the substrate, the nitride compound semiconductor layer is isolated and formed. Thereby, even when the difference exists on the coefficient of thermal expansion or the lattice constant between the substrate and the nitride compound semiconductor layer, the affect therefrom is able to be suppressed. Hence, the crack is prevented from being occurred in the convex shaped nitride compound semiconductor layer, and the nitride compound semiconductor layer becomes possible to be formed thick. Therefore, such as a silicon substrate or the like, as a low price substrate, becomes possible to be used. Moreover, the semiconductor element of which both the high withstand voltage and the low on-resistance are obtained, is able to be popularized at a low price.

In a vertical semiconductor element according to a third aspect of the present invention, at least one part of the nitride compound semiconductor layer is a high density impurity doped layer and the bypass part connects electrically a part of the one surface of the electro-conductive substrate where the nitride compound semiconductor layer is not formed and the high density impurity doped layer.

In a vertical semiconductor element according to a fourth aspect of the present invention, the electro-conductive substrate comprises an n-type silicon substrate, the nitride compound semiconductor layer comprises an n-type GaN layer, and the bypass part comprises a Ti layer contact to the nitride compound semiconductor layer and the part of the one surface of the electro-conductive substrate where the nitride compound semiconductor layer is not formed an Al layer formed on the Ti layer.

In a vertical semiconductor element according to a fifth aspect of the present invention, a plurality of the nitride compound semiconductor layers formed on the one surface of the electro-conductive substrate are electrically connected by the first electrode.

In a vertical semiconductor element according to a sixth aspect of the present invention, the second electrode is formed on a via which passes from another surface of the electro-conductive substrate through the buffer layer to the nitride compound semiconductor layer.

According to the aspect, a via is formed to pass from the rear surface of the substrate, through the buffer layer, to the nitride compound semiconductor layer. And, the second electrode is formed on the rear surface to contact with the nitride compound semiconductor layer through the via. Thereby, without passing through the buffer layer having a high resistance, the second electrode is able to be electrically connected with the first electrode, which is formed on the surface of the nitride compound semiconductor layer through the buffer layer on the substrate. Therefore, the Schottky barrier diode having the low on-resistance and the small chip size can be realized.

In a vertical semiconductor element according to a seventh aspect of the present invention, one of the first electrode and the second electrode is a Schottky electrode, and another one is an ohmic electrode.

In a vertical semiconductor element according to a eighth aspect of the present invention, the electro-conductive substrate comprises an n-type silicon substrate, and the nitride compound semiconductor layer comprises an n-type GaN layer.

In a vertical semiconductor element according to a ninth aspect of the present invention, a plurality of the nitride compound semiconductor layers formed on the one surface of the electro-conductive substrate are electrically connected by the first electrode.

A method of manufacturing a vertical semiconductor element according to a tenth aspect of the present invention comprises: a step for forming a buffer layer and a nitride compound semiconductor layer to grow on one surface of an electro-conductive substrate, and forming a plurality of convex shape nitride compound semiconductor layers thereon; and a step for forming a bypass part which connects electrically a part of the one surface of the electro-conductive substrate where the nitride compound semiconductor layer is not formed, and at least one part of the nitride compound semiconductor layer.

DETAILED DESCRIPTION OF THE INVENTION

Embodiments of the present invention will be described in detail below, based on the drawings.

The First Embodiment

Figure 1:
FIG. 1 (a) to (e) are cross sectional views showing manufacturing processes of a power semiconductor element as a vertical semiconductor element according to the first embodiment of the present invention.
Figure 1:
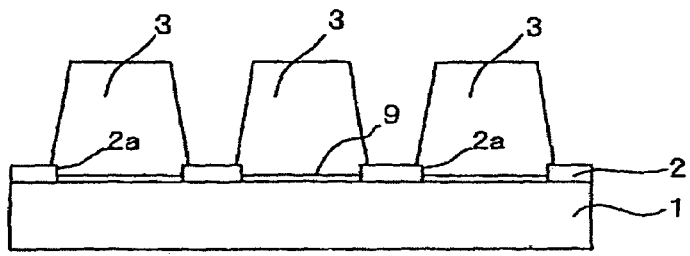
Figure 1:
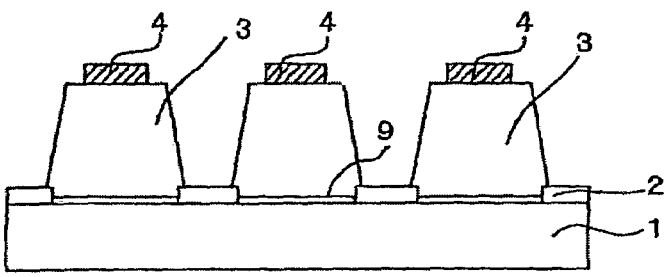
Figure 1:
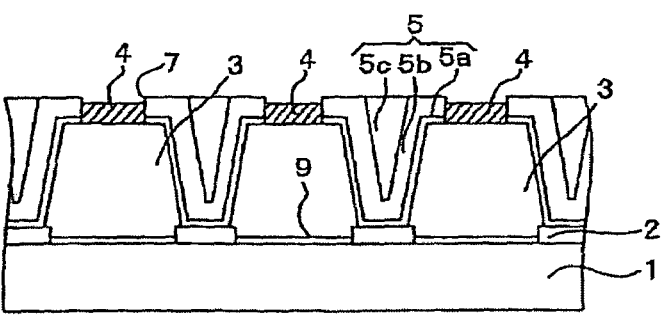
Figure 1:
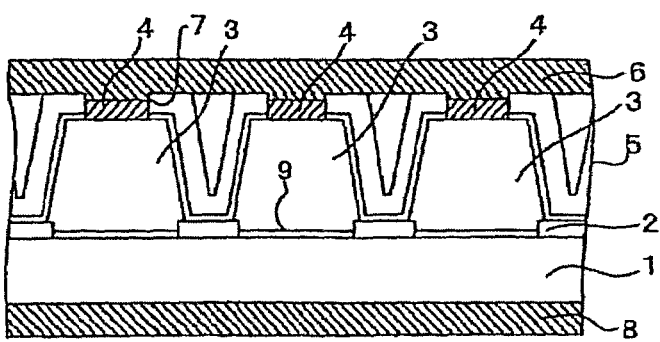

FIG. 1 (a) to (e) are cross sectional views showing manufacturing processes of a Schottky barrier diode as a power semiconductor element which is a vertical semiconductor element according to the first embodiment of the present invention.

First, as shown in FIG. 1 (a), on a (111) surface or a (001) surface of an n-type silicon substrate (an electro-conductive substrate) 1, a mask 2 for the selective growth is formed. Moreover, the mask 2 for the selective growth is formed using a method as described below.

For example, on the silicon substrate 1, a film of such as a silicon nitride ($SiN_x$), a silicon dioxide ($SiO_2$), or the like, is formed using a plasma chemical vapor deposition (CVD) method, for having a thickness of approximately 100 nm. And then a photoresist pattern is formed on the film layer. Moreover, using the photoresist pattern as a mask, the film layer is etched. Thus, the patterned film layer is to be the mask 2 for the selective growth.

Figure 2:
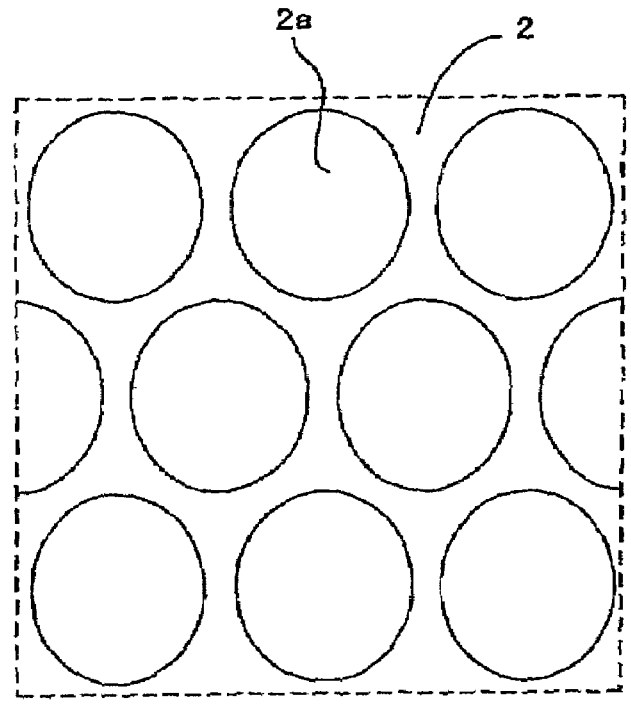
FIGS. 2 (a) and (b) are plan views showing masks for the selective growth used in the manufacturing processes of the semiconductor power device element according to the first embodiment of the present invention.
Figure 2:
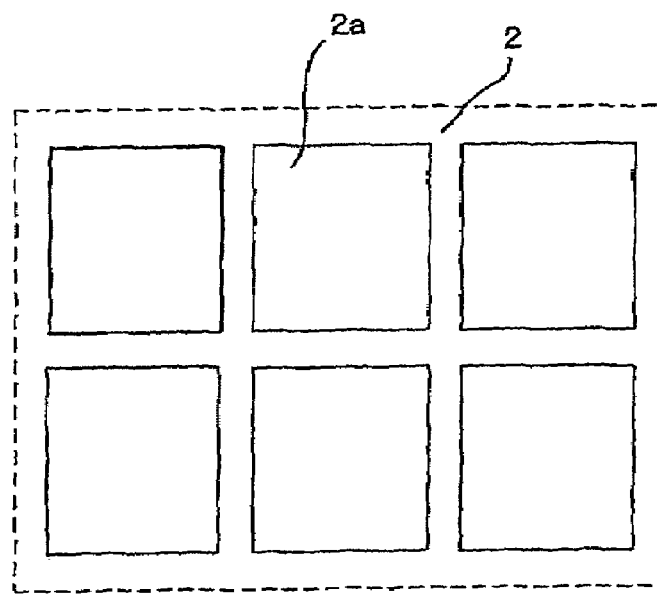

In the mask 2 for the selective growth, for example, as shown in FIG. 2 (a), a plural number of circular openings 2a each having a diameter of approximately 40 μm are aligned so as to be a closest packing structure. For example, the distance between each center of the neighboring circular openings 2a is assumed to be 50 μm approximately. Or, as shown in FIG. 2 (b), a plural number of square openings 2a each having a length of approximately 40 μm on a side are aligned with a space of approximately 10 μm in length and breadth directions. Here, the openings part 2a may be other shape, such as polygonal for example.

As the etching method used for forming the pattern of the mask 2 for selective growth, for example, in the case of a silicon nitride film as the constituent material, a reactive ion etching (RIE) using a $CF_4$ as an etching gas is used, and in the case of a silicon oxide as the constituent material, a wet etching method using a buffered hydrofluoric acid (BHF) is used.

Following the formation of the mask 2 for selective growth, the surface of the silicon substrate 1 is thermally cleaned at approximately 1100° C. for example.

Next, as shown in FIG. 1(b), on the (111) surface or the (001) surface of the silicon substrate 1, which is exposed from the circular opening 2a of the mask 2 for the selective growth, an AlN buffer layer 9 and a convex shaped GaN layer 3 are selectively grown. The GaN layer 3 becomes a carrier moving layer of the power semiconductor element comprising the nitride compound semiconductor selectively grown as convex shape on the substrate. The buffer layer 9 is grown on an one surface of the silicon substrate (an electro-conductive substrate) 1.

The AlN buffer layer 9 is grown to a thickness of approximately 30-300 nm, for example, using a metalorganic chemical vapor deposition (MOCVD) method. In this case, a trimethylaluminum (TMA) as a source gas for group III elements is introduced into a reaction chamber (not shown) with a flow rate of 14 μmol/min approximately, using a hydrogen gas as a carrier gas. Moreover, as the source gas for group V elements, an ammonia ($NH_3$) is introduced into the reaction chamber with the flow rate of 12 l/min approximately.

Furthermore, the GaN layer 3 is grown to a thickness of approximately 10 μm or more, for example by the MOCVD. In this case, using a 100% pure hydrogen gas as a carrier gas, a trimethylgallium (TMG) as a source gas for group III elements is introduced into the reaction chamber with a flow rate of 58 μmol/min approximately. Moreover, as the source gas for group V elements, the ammonia is introduced into the reaction chamber with the flow rate of 12 l/min approximately. Moreover, at the time of growing the AlN buffer layer 9 and the GaN layer 3, a substrate temperature is set at approximately 1050° C. for example.

Into the AlN buffer layer 9, the silicon as an n-type dopant is incorporated with a density of $1\times10^{18}/cm^3$. And, into the GaN layer 3, the silicon as an n-type dopant is incorporated with a density of $1\times10^{16}/cm^3$. Furthermore, as the source gas for the silicon, a silane ($SiH_4$) is used.

Next, as shown in FIG. 1 (c), on each upper surface of a plurality of GaN layers 3 respectively formed into a convex shape, Schottky electrodes 4, each of which has a Schottky contacting with the GaN layers 3, are formed by using a lift-off technology. That is to say, by spreading a photoresist (not shown) onto the silicon substrate 1, each of convex shape GaN layers 3 is coated. And then by exposing the photoresist and developing thereof, on each upper surface of convex shape GaN layers 3, a window is formed. Moreover, for each inside of the window and onto the photoresist, a metal film layer is formed using such as a spattering method, a vacuum vapor deposition method, or the like. And then by removing the photoresist, the left part of the metal film layer on the GaN layer 3 is to be the Schottky electrode 4.

As the metal film layer for the Schottky electrode 4, for example, a platinum (Pt) of a thickness of approximately 100 nm is adopted.

In the case of the upper surface of the GaN layer 3 as a circle shape, a planer shape of the Schottky electrode 4 is to be a circle pattern having a diameter of 40 μm approximately. Moreover, in the case of the upper surface as a square shape, the planer shape of the Schottky electrode 4 is to be a square pattern having approximately 40 μm on a side.

Next, as shown in FIG. 1 (d), each upper surface of the Schottky electrode 4 is exposed, and then an insulator film layer 5 is formed for surrounding the whole GaN layer 3. That is to say, as the insulator film layer 5, for example, a $SiO_2$ film layer 5a, a $SiN_x$ film layer 5b, and another $SiO_2$ film layer 5c are adopted as a three layers structure.

The $SiO_2$ film layer 5a as the first layer is formed to be a thickness of approximately 100 nm by the plasma CVD method, using a $SiH_4$ and an $N_2O$ as the source gases. Moreover, the $SiN_x$ film layer 5b as the second layer, is formed to grow a thickness of approximately 300 nm, using the $SiH_4$ and an $N_2$ (or the $NH_3$).

As a forming method of the $SiO_2$ film layer 5c as the third layer, either method of a forming method by the plasma CVD using a tetraethoxysilane (TEOS) and an oxygen ($O_2$) as the source gases, or another forming method by the plasma CVD using the TEOS and an ozone ($O_3$) as the source gases, is adopted. Thereby, all of concave parts among the convex shape GaN layers 3 are surrounded.

After forming the film layer, the upper surfaces of such the insulator film layer 5 are flattened using a chemical mechanical polishing (CMP) method. In this case, the $SiN_x$ film layer 5b as the second layer functions as an etch stop layer, and then the $SiO_2$ film layer 5c as the third layer is polished. As a slurry used for the CMP, a colloidal silica or a ceria based is used. And then until a part of the $SiN_x$ film layer 5b exposing, it is flattened.

Next, the $SiN_x$ film layer 5b as the second layer and the $SiO_2$ film layer 5a as the first layer, existing on the Schottky electrodes 4 are etched and openings 7 is formed, by a photolithography method using a photoresist.

The $SiN_x$ film layer 5b is etched by RIE method using $CF_4$ as the etching gas. Moreover, the $SiO_2$ film layer 5a is etched using the buffered hydrofluoric acid.

Next, as shown in FIG. 1 (e), for connecting with each Schottky electrode 4, an upper wiring pattern 6 is formed on the insulator film layer 5 and inside the openings 7. As the upper wiring pattern 6, for example, an aluminum (Al) film layer is formed to be a thickness of approximately 3 μm, by the spattering method, the vacuum vapor deposition method, or the like. In the case of pattering the Al film layer, the photoresist of the wiring pattern is formed on the Al film layer. And then the Al film layer is patterned by a wet etching. Regarding an etchant, a phosphoric acid, a nitric acid, an acetic acid, and an aqueous are mixed with a ratio of 16:1:2:1 to be a solution used therefor.

After the above mentioned processes, a rear electrode 8, which comprises three layers structure of Ti/Ni/Au, is formed on another side of the silicon substrate 1.

Here, in the case of die bonding with an upside down layout of the Schottky electrode 4 as a junction down, the upper wiring pattern 6 is to be comprised of Ti/Ni/Au Moreover, the rear electrode 8 is to be comprised of Al.

Thus, a power semiconductor element, which comprises a plurality of the Schottky barrier diodes with connecting in parallel, is formed thereby.

Regarding the power semiconductor element, for the n-type GaN layer 3 of the Schottky barrier diode, in every element unit having an area of 40 μm by 40 μm in length and breadth on the plane, the structure is adopted, which is formed with a thickness of more than or equal to 10 μm using the selective growth method. And then the GaN layer 3, in which any crack is hardly occurred and the crystalline is excellent, can be formed. Thus, the breakdown voltage of the Schottky barrier diode formed on the GaN layer 3 becomes possible to be as approximately 1200 (V) for example.

Here the withstand voltage of the Schottky barrier diode is improved, because the GaN layer 3 is selectively grown as thick as 10 μm approximately. Moreover, for obtaining the high breakdown voltage as the power semiconductor element, the withstand voltage of the insulator film layer 5 surrounding the GaN layer 3 is also necessary to be improved.

Figure 3:
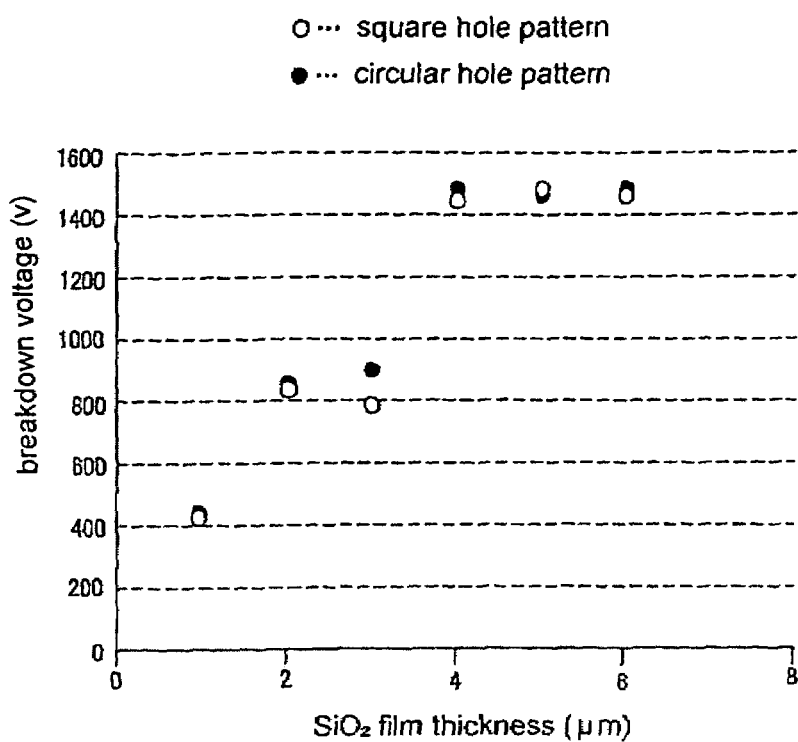
FIG. 3 is a graph showing a relationship between a breakdown voltage and a thickness of an insulator film for implanting a Schottky barrier diode as the semiconductor power device element according to the first embodiment of the present invention.

Then, with changing the thickness of the $SiO_2$ film layer 5c as the third layer structuring the insulator film layer 5, the power semiconductor element is formed. And then the breakdown voltage under the reverse bias is evaluated thereof. Hence, the result as shown in FIG. 3 is obtained; for the $SiO_2$ film layer 5c as the third layer, as thick as approximately 4 μm or more, the breakdown voltage becomes beyond the breakdown voltage for the Schottky barrier diode formed on the GaN layer 3. Therefore, in the case of the GaN layer 3 as having a thickness of 10 μm approximately, by forming the insulator film layer 5 for surrounding the GaN layer 3 with the thickness of approximately 4 μm or more, the breakdown voltage of the whole power semiconductor element becomes possible to be obtained as high as approximately 1200 (V) or more.

Figure 4:
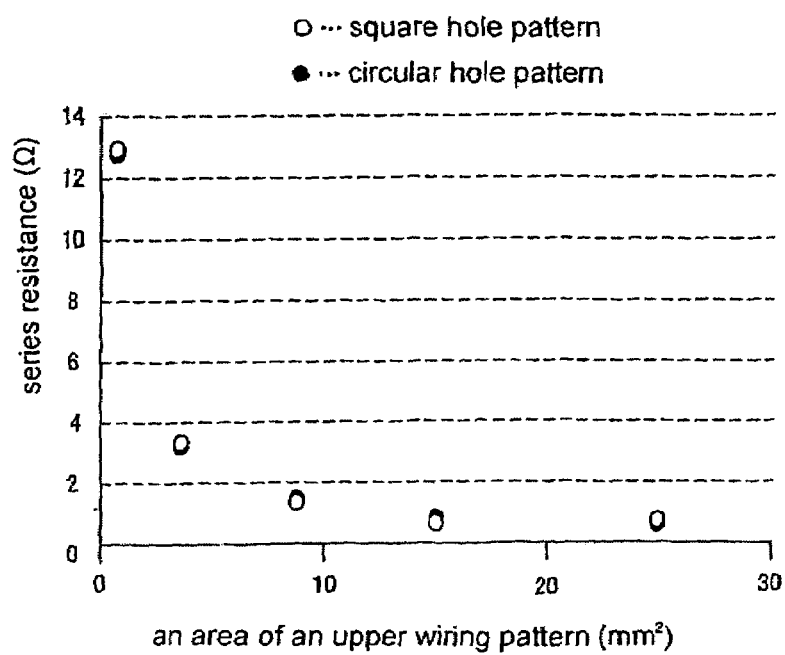
FIG. 4 is a graph showing a relationship between the series resistance of the semiconductor power device element and the wiring area connected with a Schottky electrode of the Schottky barrier diode as the semiconductor power device element according to the first embodiment of the present invention.

Moreover, with increasing the area of the upper wiring pattern 6, and with increasing the connecting numbers among cells of the Schottky barrier diode (the number of the Schottky barrier diode), the serial resistance of the power semiconductor element under the forward bias is measured. Hence, as shown in FIG. 4, following the increase of the area of the upper wiring pattern 6, the serial resistance of the power semiconductor element is decreased.

The Second Embodiment

Figure 5:
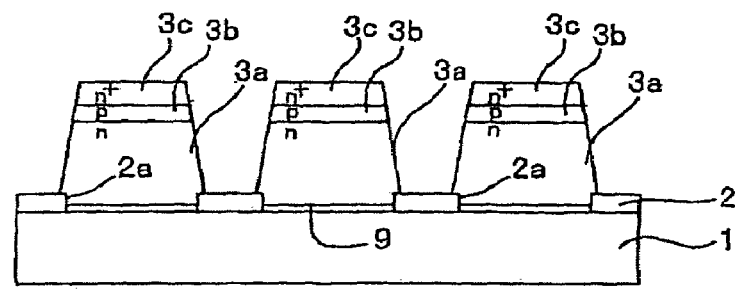
FIG. 5 (a) to (d) are cross sectional views showing manufacturing processes of a power semiconductor element as a vertical semiconductor element according to the second embodiment of the present invention.
Figure 5:
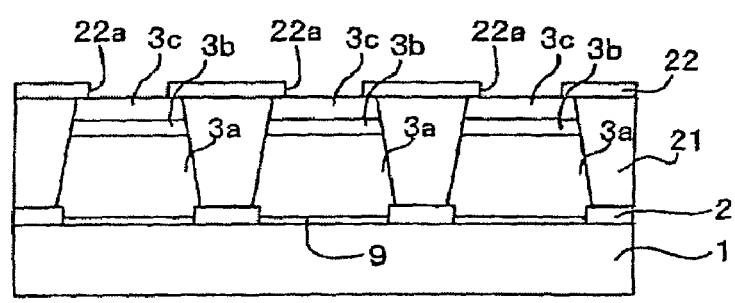
Figure 5:
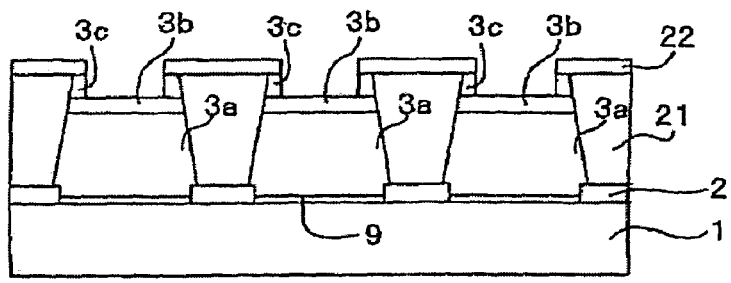
Figure 5:
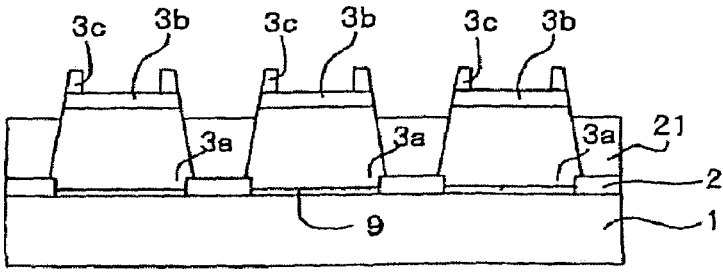
Figure 6:
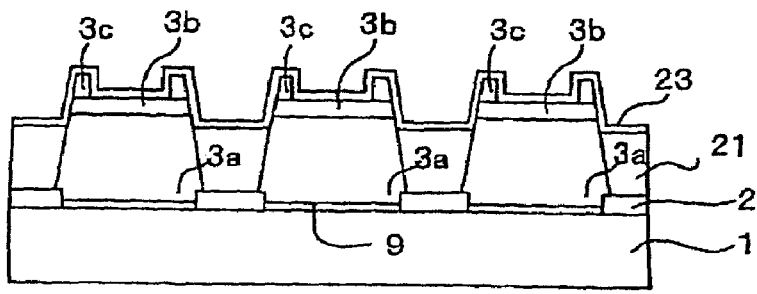
FIG. 6 (a) to (d) are cross sectional views following FIG. 5 (d) showing manufacturing processes of the semiconductor power device element.
Figure 6:
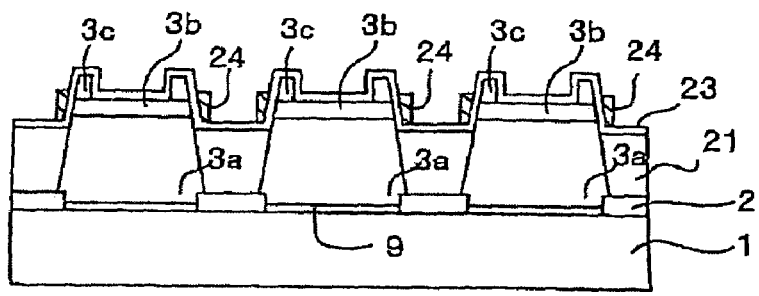
Figure 6:
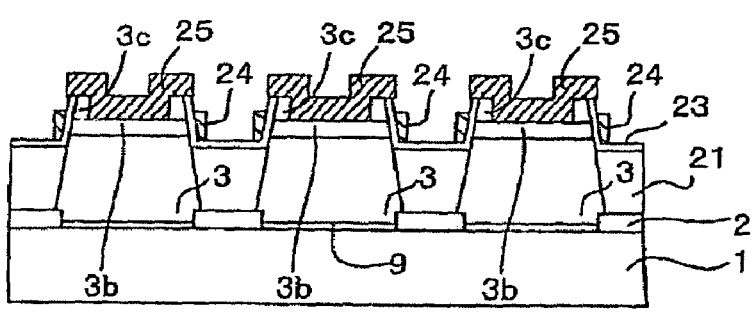
Figure 6:
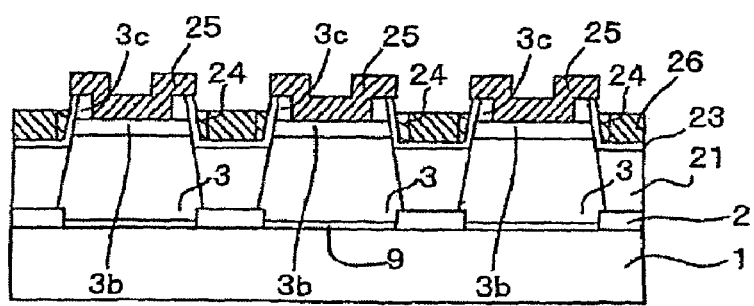
Figure 7:
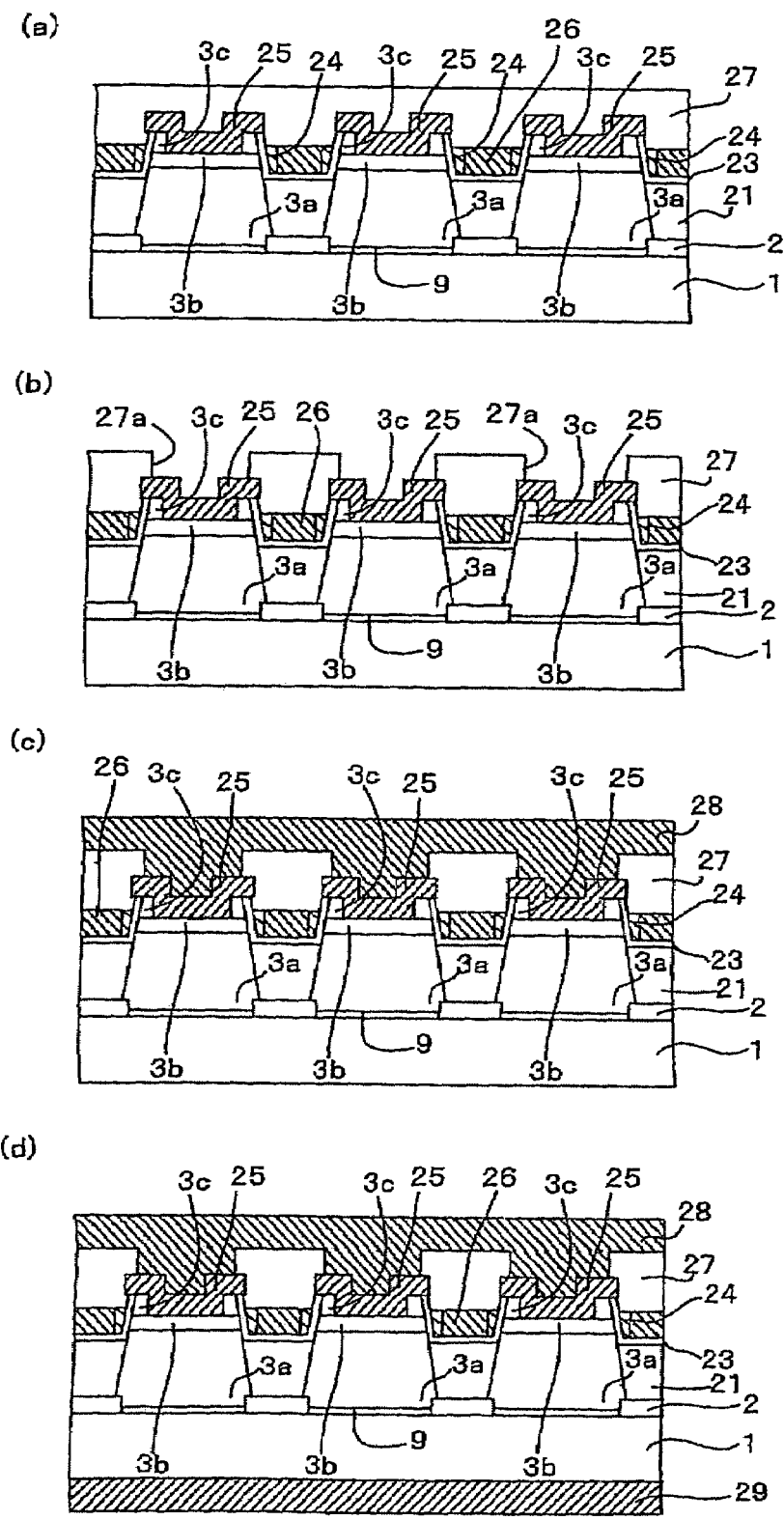
FIG. 7 (a) to (d) are cross sectional views following FIG. 6 (d) showing manufacturing processes of the semiconductor power device element.

FIG. 5 to FIG. 7 are cross sectional views showing manufacturing processes of a vertical power MOSFET for a power semiconductor element as a vertical semiconductor element regarding the second embodiment of the present invention. Here, in FIG. 5 to FIG. 7, a symbol similar to that in FIG. 1 shows the similar element.

In FIG. 5 (a), on the silicon substrate 1, using the mask 2 for selective growth, an n-type GaN layer 3a, a p-type GaN layer 3b, and an n$^+$-type GaN layer 3c are formed as three layers structure. As the total thickness of the whole three layers is approximately 10 μm or more, to grow selectively to be as convex shape nitride compound semiconductor layer, at plural parts thereon. And then the plural number of the nitride compound semiconductor layer parts, as same as the GaN layer 3 shown in FIG. 1 (e), becomes the carrier moving layer for the power semiconductor element comprising the nitride compound semiconductor selectively grown as convex shape on the substrate. Regarding the n-type GaN layer 3a, Si is doped with a density of $1 \times 10^{16}$ cm$^{-3}$ therein. Moreover, regarding the p-type GaN layer 3b, a magnesium (Mg) is doped with a density of $5 \times 10^{16}$ cm$^{-3}$ therein. Furthermore, regarding the n$^+$-type GaN layer 3c, the Si is doped with a density of $3 \times 10^{18}$ cm$^{-3}$ therein.

Regarding the selective growth method, as similar to the first embodiment, on the surface of the convex shape n-type GaN layer 3a, not only on an upper surface but also on a side surface thereof, the p-type GaN layer 3b and the n$^+$-type GaN layer 3c are grown. And then the p-type GaN layer 3b and the n$^+$-type GaN layer 3c on the side surface are removed by etching using a mask.

Next, as shown in FIG. 5 (b), on the silicon substrate 1, a part between each convex part, which comprises the n-type GaN layer 3a, the p-type GaN layer 3b and the n$^+$-type GaN layer 3c, is filled with a first insulator film layer 21 of SiO$_2$. The first insulator film layer 21 of SiO$_2$ is grown, using a forming method by the plasma CVD with the TEOS and the O$_2$ as the source gases, or using another forming method by the plasma CVD with the TEOS and the O$_3$ as the source gases. And then for obtaining approximately similar height of a top part of the n$^+$-type GaN layer 3c, the first insulator film layer 21 is polished using the CMP method and flattened.

Moreover, onto the first insulator film layer 21 and the n$^+$-type GaN layer 3c, a second insulator film layer 22 is formed to be a thickness of approximately 100 nm. And then using the photolithography method with the resist and the buffered hydrofluoric acid, with fitting the upper surface shape of the n$^+$-type GaN layer 3c, such as a circle shape, a square shape, or the like, a hole pattern 22a is formed with a similar center to that of the upper surface. In the case of adopting the circle pattern with approximately 40 μm diameter for the upper surface shape, the circular hole pattern 22 is to be opened as approximately 30 μm diameter. Moreover, in the case of adopting the square pattern with approximately 40 μm on a side therefor, the square hole pattern 22 is to be opened as approximately 30 μm on a side.

After removing the resist, as shown in FIG. 5 (c), with the second insulator film layer 22 as the mask, using a chlorine based inductively coupled plasma RIE (ICP-RIE) method, the n$^+$-type GaN layer 3c is etched, and then the upper surface of the p-type GaN layer 3b is exposed. Regarding the etching condition therefor, for example, it is set to be as a power of the ICP is 170 W approximately, a bias power of 50 W approximately, a chlorine flow rate of 7 sccm approximately, a pressure of 80 Pa approximately, and a substrate temperature of 50° C. approximately.

Next, as shown in FIG. 5 (d), the first insulator film layer 21 of SiO$_2$ and the second insulator film layer 22 of SiO$_2$ are etched until approximately 500 nm deeper than the depth of which a side of the p-type GaN layer 3b being exposed by the etching. Regarding the thickness of the first insulator film layer 21 remained after the etching, for keeping the breakdown voltage in the vertical direction thereof not less than the breakdown voltage in the perpendicular direction of the n-type GaN layer 3a, it is remained the thickness thereof.

Next, as shown in FIG. 6 (a), a gate oxide film layer 23 of SiO$_2$ is deposited to be a thickness of approximately 50 nm. Regarding a deposition method, such as the plasma CVD (PCVD), a thermal CVD, or the like, may be used. Regarding the source gases, the combination of the SiH$_4$ and the N$_2$O, or the TEOS combined with the O$_2$ or with the O$_3$, may be used.

Next, as shown in FIG. 6 (b), using the lift-off method, on a side surface of the p-type GaN layer 3b, a gate electrode 24 is formed through the gate oxide film layer 23.

Moreover, as shown in FIG. 6 (c), for the gate oxide film layer 23, areas for forming source electrodes are etched, which ohmic contact with a top part of the n$^+$-type GaN layer 3c and the p-type GaN layer 3b respectively. During the etching thereof, other areas are surrounded by a resist pattern (not shown). And then using the lift-off method, for ohmic contacting with each top part of the n$^+$-type GaN layer 3c and the p-type GaN layer 3b, the source electrode 25 is formed. Furthermore, for the source electrode 25, a Ti (30 nm)/Al (500 nm) layered structure is to be adopted.

Next, as shown in FIG. 6 (d), for connecting with each of a plurality of gate electrodes 24, a first wire 26 of aluminum is formed on the insulator film layer 21.

Next, as shown in FIG. 7 (a), for surrounding plural parts of the gate electrode 24, the first wire 26 and the source electrode 25, a third insulator film layer 27 is formed. Regarding the third insulator film layer 27, for example, using the method similar to the first insulator film layer 21, the SiO$_2$ film is to be deposited.

Moreover, as shown in FIG. 7 (b), using the photolithography with the photoresist and the buffered hydrofluoric acid, the third insulator film layer 27 is patterned. And then an opening 27a is formed, for exposing a plurality of upper surfaces of the source electrode 25.

Next, as shown in FIG. 7 (c), inside the opening 27a and on the third insulator film layer 27, for connecting with each source electrode 25, a second wire 28 is formed.

After the above mentioned processes, as shown in FIG. 7 (d), on the rear surface of the Si substrate 1, a drain electrode 29 is formed, which comprises a layered structure of Ti(20 nm)/Ni(700 nm)/Au(20 nm).

Regarding the power MOSFET having the above mentioned structure, by applying a predetermined voltage onto the gate electrode 24, the depletion layer and an inversion layer are formed in the p-type GaN layer 3b. Moreover, through the inversion layer, the carrier is to be flowed between the n-type GaN layer 3a and the n⁺-type GaN layer 3c.

Regarding such the power MOSFET, as similar to the first embodiment, the n-type GaN layer 3a is formed as thick as approximately 10 nm or more for example. And then the breakdown voltage of approximately 1200 (V) is able to be obtained thereby.

Figure 8:
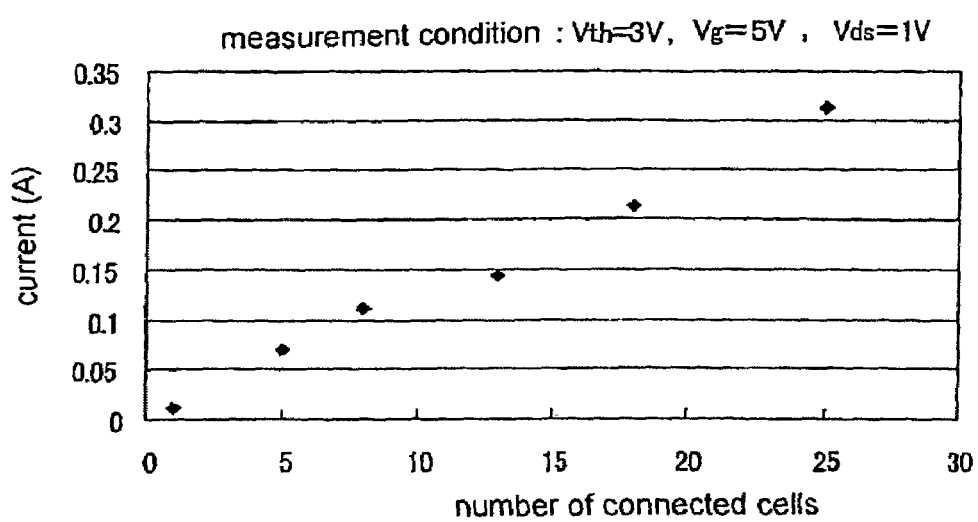
FIG. 8 is a graph showing a characteristic of on-state of a MOSFET as a power semiconductor element according to the second embodiment of the present invention.

Regarding an on-state characteristic of the power MOSFET, as shown in FIG. 8, with increasing the connecting numbers of the convex shape GaN cells, in proportion thereto, the current being able to be flowed is also increased. Here, the measurement conditions are shown in FIG. 8.

Moreover, regarding the first and the second embodiment, instead of the convex shape GaN layers 3 and 3a to 3c, other nitride compound group III-V semiconductor layers may be formed. Furthermore, regarding the element formed in the nitride compound group III-V semiconductor layers of convex shape, the IGBT, a heterojunction FET, or the like, may be used.

The Third Embodiment

Figure 9:
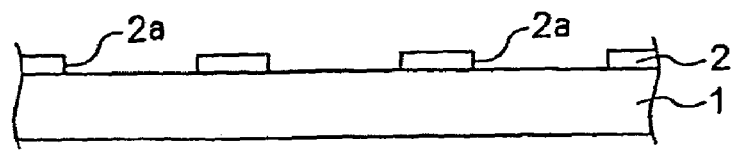
FIG. 9 (a) to (e) are cross sectional views showing manufacturing processes of a power semiconductor element as a vertical semiconductor element according to the third embodiment of the present invention.
Figure 9:
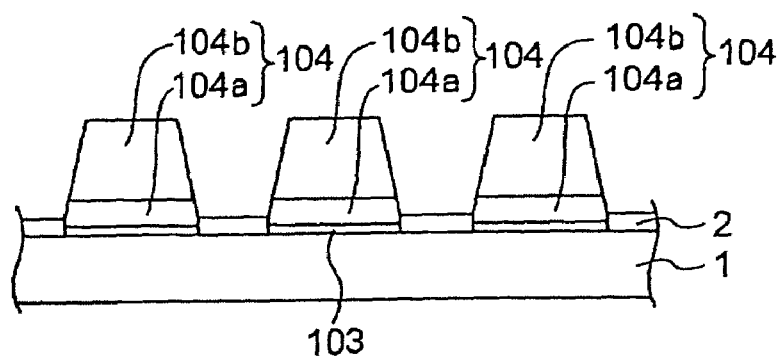
Figure 9:
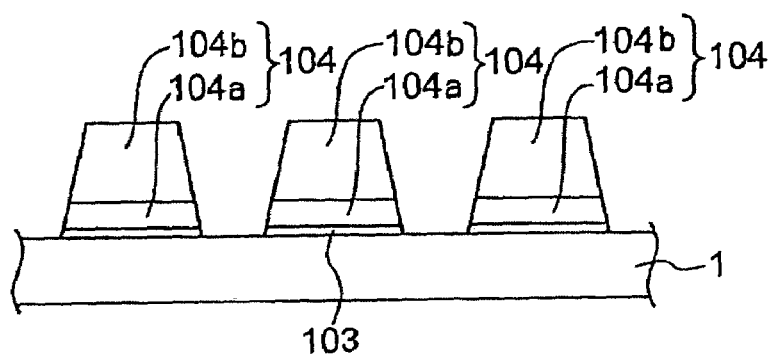
Figure 9:
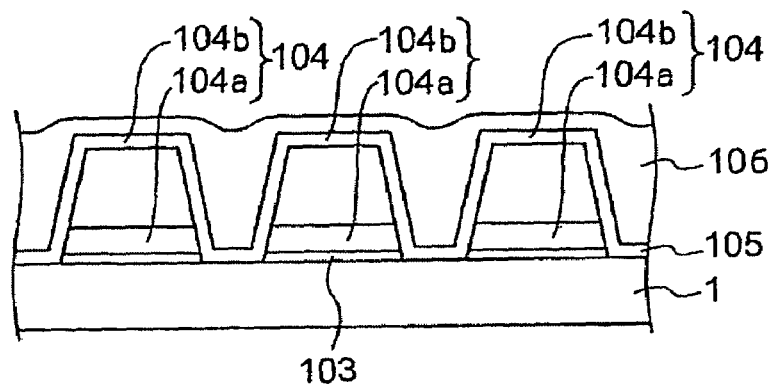
Figure 9:
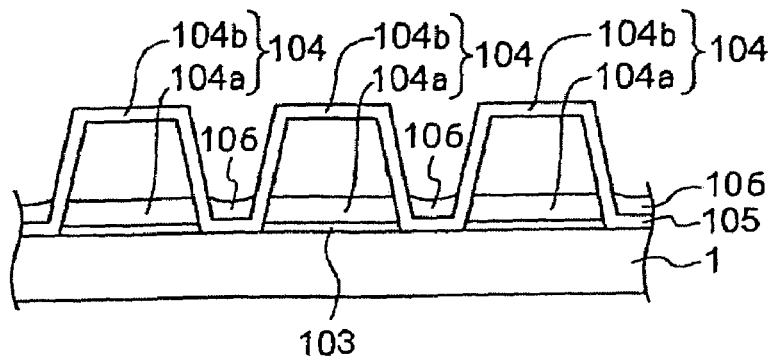
Figure 10:
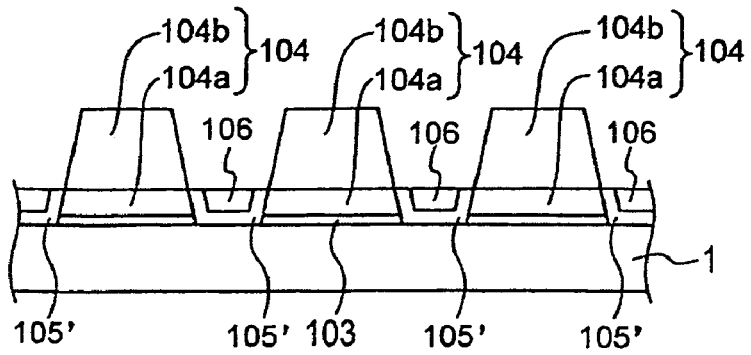
FIG. 10 (a) to (d) are cross sectional views following FIG. 9 (e) showing manufacturing processes of the semiconductor power device element.
Figure 10:
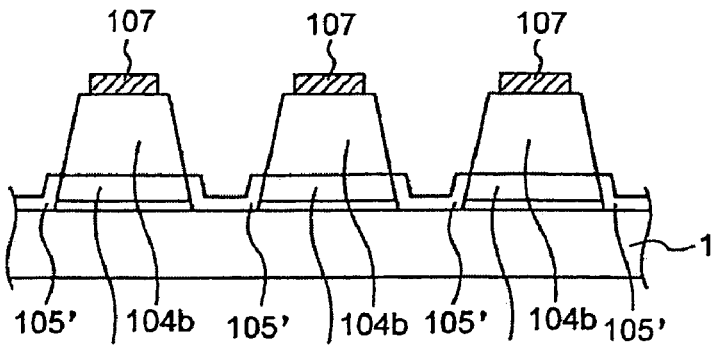
Figure 10:
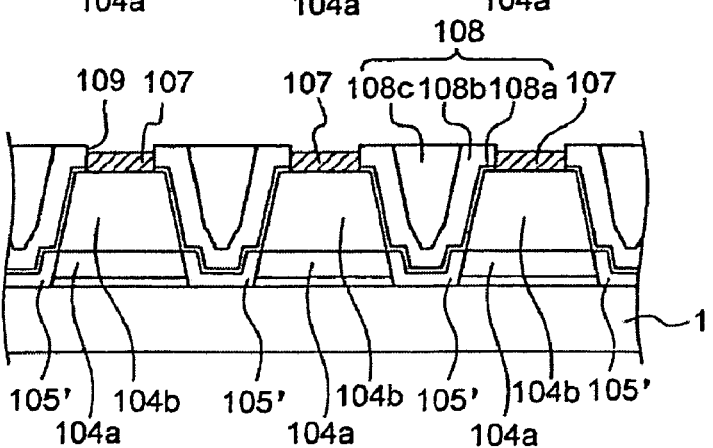
Figure 10:
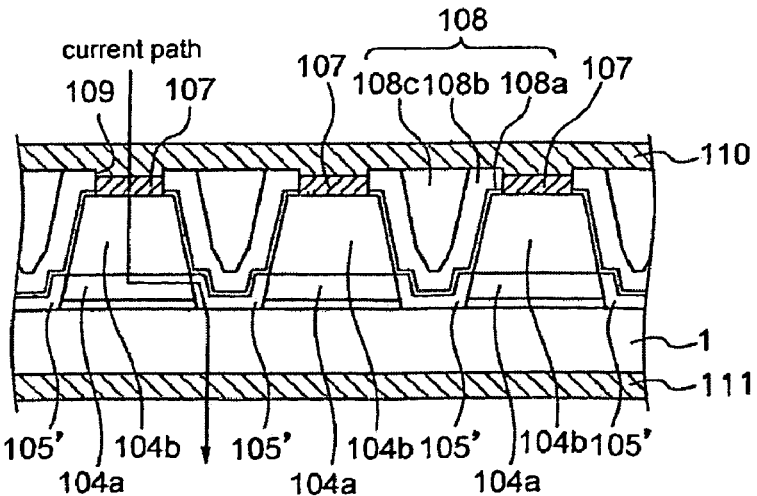

FIG. 9 and FIG. 10 are cross sectional views showing manufacturing processes of a Schottky barrier diode as a vertical semiconductor element regarding the third embodiment of the present invention.

First, as shown in FIG. 9 (a), the silicon substrate 1 is prepared, and then on the (111) surface or the (001) surface of the silicon substrate 1, the mask 2 for selective growth is formed. As the silicon substrate 1, the n-type electro-conductive silicon substrate is used, of which a specific resistance is not more than 0.1 Ωcm, or preferably not more than 0.01 Ωcm. Or, as the silicon substrate 1, the silicon substrate of which resistance is lowered by doping n-type impurities, such as P, As, Sb, and the like into the silicon substrate, by using an ion implantation method or a thermal diffusion method.

The mask 2 for selective growth is formed using the following method.

For example, on the silicon substrate 1, a film such as the silicon nitride ($SiN_x$), the silicon oxide ($SiO_2$), or the like, is formed to be a thickness of approximately 100 nm, using the plasma CVD method. Moreover, onto the film layer, a photoresist pattern is formed. And then using the photoresist as a mask, the film layer is etched. Thus, the patterned film layer becomes the mask 2 for selective growth.

Regarding the mask 2 for the selective growth, for example, as shown in FIG. 2 (a), a plural number of an open circle 2a having an approximately 40 μm diameter is aligned for structuring a closest packing. For example, the distance between each center of the neighboring open circle 2a is assumed to be 50 μm approximately. Or, as shown in FIG. 2 (b), a plural number of an open square 2a of approximately 40 μm on a side is aligned with spacing 10 μm approximately in length and breadth direction. Here, the circular opening 2a may be other shape, such as polygonal for example.

Regarding the etching method used for forming the pattern of the mask 2 for selective growth, for example, in the case of the silicon nitride film as the constituent material, using the $CF_4$ as the etching gas, the reactive ion etching (RIE) method is used therefor. Moreover, in the case of the silicon oxide as the constituent material, with the buffered hydrofluoric acid, the wet etching method is used therefor.

Following the formation of the mask 2 for selective growth, the surface of the silicon substrate 1 is thermally cleaned at approximately 1100° C. for example.

Next, as shown in FIG. 9 (b), on the (111) surface or the (001) surface of the silicon substrate 1, which is exposed from the circular opening 2a of the mask 2 for the selective growth, an AlN buffer layer 103 and a convex shaped GaN layer 104 are selectively grown. And then the GaN layer 104 becomes a carrier moving layer of an electron device. Moreover, it comprises an n⁺-type GaN layer 104a, in which n-type impurities are doped with a high density, and an n⁻-type GaN layer 104b, in which n-type impurities are doped with a low density.

The AlN buffer layer 103 is formed to grow a thickness of approximately 30-300 nm, for example by a metalorganic chemical vapor deposition (MOCVD) method. In this case, using a hydrogen gas as a carrier gas, a trimethylaluminum (TMA) as a source gas for group III elements is introduced into a reaction chamber (not shown) with a flow rate of approximately 14μ mol/min. Moreover, as the source gas for group V elements, an ammonia ($NH_3$) is introduced into the reaction chamber with the flow rate of 12 l/min approximately.

Into the AlN buffer layer 103, the silicon as an n-type dopant is incorporated with a density of $1\times10^{18}/cm^3$. Moreover, as the source gas for the silicon, a silane ($SiH_4$) is able to be used.

Furthermore, for the buffer layer, instead of the AlN layer, an AlGaN layer may be formed as well.

The GaN layer 104 is formed as described below, for example by the MOCVD method, That is to say, using a 100% pure hydrogen gas as a carrier gas, a trimethylgallium (TMG) as a source gas for group III elements is introduced into the reaction chamber. Moreover, the ammonia, as the source gas for group V elements, and the silane ($SiH_4$), as the source gas for the silicon as the n-type impurity, are introduced into the reaction chamber as well. And then the n⁺-type GaN layer 104a, having a high impurity density of $1\times10^{18}$ cm⁻³ or more, such as $5\times10^{18}$ cm⁻³ for example, is formed to grow as a thickness of approximately 1 μm.

Regarding the flow rate of each source gas, for example, for the trimethylgallium it is 58μ mol/min approximately, for the ammonia it is 12 l/min approximately, and for the silane ($SiH_4$) it is 9.0 n mol/min approximately.

Moreover, following the above mentioned processes, for example, the trimethylgallium, the ammonia and the silane ($SiH_4$) are introduced into the reaction chamber, with the approximate flow rate of 58μ mol/min, 12 l/min and 0.018 n mol/min respectively. And then the n⁻-type GaN layer 104b, having the impurity density of approximately $1\times10^{16}$ cm⁻³, is formed to grow as a thickness of 5 μm or more, for example a thickness of 10 μm.

Furthermore, at the time of the AlN buffer layer 103 and the GaN layer 104 growing, a substrate temperature is set as approximately 1050° C. for example.

Next, as shown in FIG. 9 (c), the mask 2 for selective growth is removed. To be specific, using a hydrofluoric acid or the buffered hydrofluoric acid, the mask 2 for selective growth is removed.

Next, as shown in FIG. 9 (d), for all over the upper surface of the silicon substrate 1, an electro-conductive layer 105, comprising a layered structure of Ti(25 nm)/Al(500 nm), is formed using such as the spattering method, the vacuum vapor deposition method, or the like.

Next, for filling concave parts among a plurality of GaN layer 104 formed as convex shape, a resist 106 is spread onto the electro-conductive layer 105. And then the resist 106 is prebaked to be hardened.

Next, as shown in FIG. 9 (e), using such as an oxygen based asher, an oxygen based RIE equipment, or the like, the resist 106 is etchbacked. Regarding an end point of the etchback, at an interface between the n⁺-type GaN layer 104a and the n⁻-type layer 104b, that is to say, at the height of approximately 1 μm from the surface of the silicon substrate 1, it is to be set therefor.

Next, as shown in FIG. 10 (*a*), using the buffered hydrofluoric acid for example, the electro-conductive layer 105 is etched. And then the electro-conducive layer 105, of which parts without being surrounded by the resist 106, is removed. Thus, a bypass electrode (a bypass part) 105' is formed, which connects electrically with a side of the GaN layer 104 and the surface of the silicon substrate 1. The bypass electrode (a bypass part) 105' comprises a Ti layer.

Regarding the silicon substrate 1 and the n⁺-type GaN layer 104a, high density of n-type impurities are doped into both of them. Hence, contact resistances between the bypass electrode 105' and the silicon substrate 1, and between the bypass electrode 105' and the n⁺-type GaN layer 104a, are able to be decreased. And then an ohmic contact with the bypass electrode 105', which is comprised of Ti/Al layers, becomes possible.

Moreover, the bypass electrode 105' may be formed for contacting with at least a part of the n⁺-type GaN layer 104a, on the side surface of the GaN layer 104. From the point of view of decreasing the contact resistance between the bypass electrode 105' and the GaN layer 104, wider contacting area is preferable. However, in the case of the bypass electrode 105' contacting not only with n⁺-type GaN layer 104a but also with the n⁻-type GaN layer 104b, an effective carrier moving layer cannot help but become thinner. And then the withstand voltage becomes possible to be ensured. Therefore, the bypass electrode 105' is preferable to be structured as contacting only with the n⁺-type GaN layer 104a.

Next, as shown in FIG. 10 (*b*), the resist, which is left in the concave parts among the convex shape GaN layer 104, is removed therefrom. And then on each upper surface of the GaN layer 104 which is formed into a plurality of convex shape parts, a Schottky electrode 107 for Schottky contacting is formed using a lift-off technology. That is to say, by spreading a photoresist (not shown) onto the silicon substrate 1, each convex shape part of the GaN layer 104 is coated. And then by exposing the photoresist and developing thereof, on the upper surface of each convex shape part of the GaN layer 104, a window is formed. Moreover, for each inside of the window and onto the photoresist, a metal film layer is formed using such as a spattering method, a vacuum vapor deposition method, or the like. And then by removing the photoresist, the left part of the metal film layer on the GaN layer 104 becomes the Schottky electrode 107.

Regarding the metal film layer for the Schottky electrode 107, for example, a platinum (Pt) of a thickness of approximately 100 nm is adopted.

In the case of the upper surface of the GaN layer 104 as a circle shape, a planer shape of the Schottky electrode 107 is to be a circle pattern having a diameter of 40 μm approximately. Moreover, in the case of the upper surface as a square shape, the planer shape of the Schottky electrode 107 is to be a square pattern of approximately 40 μm on a side.

Next, as shown in FIG. 10 (*c*), each upper surface of the Schottky electrode 107 is exposed, and then an insulator film layer 108 is formed for surrounding the whole GaN layer 104. That is to say, as the insulator film layer 108, for example, a SiO₂ film layer 108a, a SiN$_x$ film layer 108b, and another SiO₂ film layer 108c are adopted as a three layers structure.

The SiO₂ film layer 108a as the first layer is formed to be a thickness of approximately 100 nm, by the plasma CVD method using the SiH₄ and the N₂O as the source gases. Moreover, regarding the SiN$_x$ film layer 108b as the second layer, with the SiH₄ and the N₂ (or the NH₃), it is formed to grow as a thickness of approximately 300 nm.

As a forming method of the SiO₂ film layer 108c as the third layer, either forming method of a method by the plasma CVD using the tetraethoxysilane (TEOS) and the oxygen (O₂) as the source gases, or a method by the plasma CVD using the TEOS and the ozone (O₃) as the source gases is adopted. And then all of concave parts among the convex shape GaN layer 104 are filled therewith.

Moreover, after forming the film layer, the upper surfaces of such the insulator film layer 108 are flattened using the chemical mechanical polishing (CMP) method. In this case, the SiN$_x$ film layer 108b as the second layer functions as an etch stop layer, and then the SiO₂ film layer 108c as the third layer is polished. Regarding the slurry used for the CMP, the colloidal silica or the ceria based is used. And then until a part of the SiN$_x$ film layer 108b being exposed, it is flattened.

Next, using the photolithography method using the photoresist, the SiN$_x$ film layer 108b as the second layer and the SiO₂ film layer 108a as the first layer on the Schottky electrode 107 are etched, and then open parts 109 are formed.

Regarding the SiN$_x$ film layer 108b, with the CF₄ as the etching gas, it is etched using the RIE method. Moreover, the SiO₂ film layer 108a is etched using the buffered hydrofluoric acid.

Next, as shown in FIG. 10 (*d*), for connecting with each Schottky electrode 107, an upper wiring pattern 110 is formed on the insulator film layer 108 and inside the open parts 109. Regarding the upper wiring pattern 110, for example, an aluminum (Al) film layer is formed, using such as the spattering method, the vacuum vapor deposition method, or the like, to be a thickness of approximately 3 μm. In the case of pattering the Al film layer, the photoresist of the wiring pattern is formed on the Al film layer. And then the Al film layer is patterned by the wet etching. Regarding the etchant, the phosphoric acid, the nitric acid, the acetic acid, and the aqueous are mixed with the ratio of 16:1:2:1 to be the solution used therefor.

After the above mentioned processes, an ohmic electrode 111, which comprises three layers structure of Ti/Ni/Au, is formed on rear surface of the silicon substrate 1 using the vapor deposition method.

Here, in the case of die bonding with the upside down layout of the Schottky electrode 107 as the junction down, the upper wiring pattern 110 is to be comprised of Ti/Ni/Au Moreover, the ohmic electrode 111 is to be comprised of Al.

Thus, the power semiconductor element, which comprises a plurality of the Schottky barrier diodes with connecting in parallel, is formed thereby.

Regarding the above structured Schottky barrier diode, at the time of applying a predetermined voltage onto the Schottky electrode 107, the carrier in the n-type GaN layer 104 is moved toward the Schottky electrode 107. Hence, as shown with an arrow in FIG. 10 (*d*), the current is to be flowed from the Schottky electrode 107, through the n⁻-type GaN layer 104b and the n⁺-type GaN layer 104a, through the bypass electrode 105', to the silicon substrate 1 and then the ohmic electrode 111.

That is to say, regarding the power semiconductor element of the present embodiment, the bypass electrode 105' exists, which electrically connects with the side of the GaN layer 104 and the surface of the silicon substrate 1. Therefore, the current, which passes through the AlN buffer layer 103 as the wide band gap semiconductor, becomes able to be decreased. And then the on-resistance becomes possible to be reduced thereby.

Moreover, regarding the present embodiment, for the n-type GaN layer 104 of the Schottky barrier diode, in every element unit having an area of 40 μm by 40 μm in length and breadth on the plane, the structure is adopted, which is formed with the thickness of approximately 5 μm or more using the selective growth method. And then onto the silicon substrate 1, the GaN layer 104, in which any crack is hardly occurred and the crystalline is excellent, becomes possible to be formed. Thus, using the silicon substrate as a low price, the Schottky barrier diode, which has the breakdown voltage of approximately 1200 (V) for example, becomes possible to be offered.

Next, in the case of the bypass electrode not being formed with comparing to being formed, an actual measurement result of the on-resistance of the Schottky barrier diode is described below.

Comparing to the on-resistance in the case of the bypass electrode not being formed as 0.24 mm $\Omega cm^2$ approximately, the on-resistance in the case of the bypass electrode being formed is approximately 0.01 mm $\Omega cm^2$. Therefore, an sufficient effectivity is able to be confirmed on forming the bypass electrode for reducing the on-resistance.

The Fourth Embodiment

Figure 11:
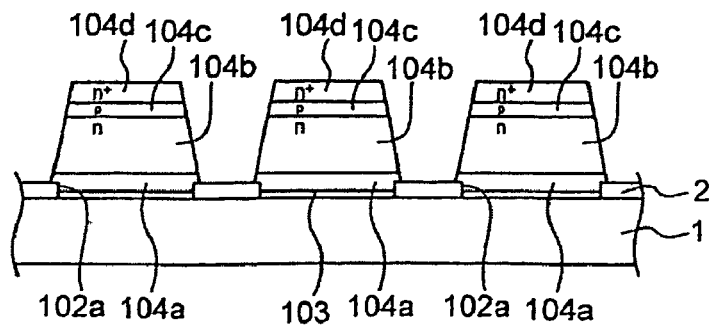
FIG. 11 (a) to (d) are cross sectional views showing manufacturing processes of a power semiconductor element as a vertical semiconductor element according to the fourth embodiment of the present invention.
Figure 11:
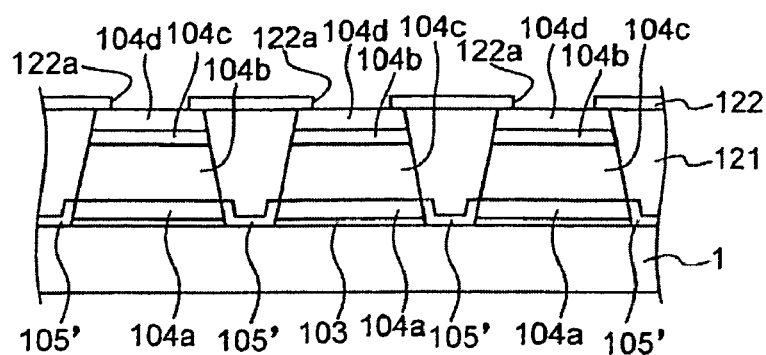
Figure 11:
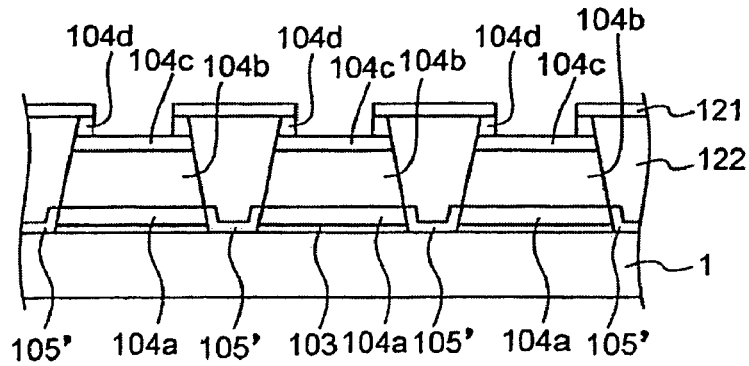
Figure 11:
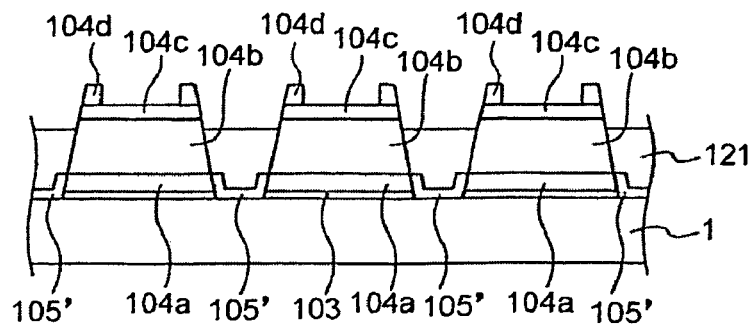
Figure 12:
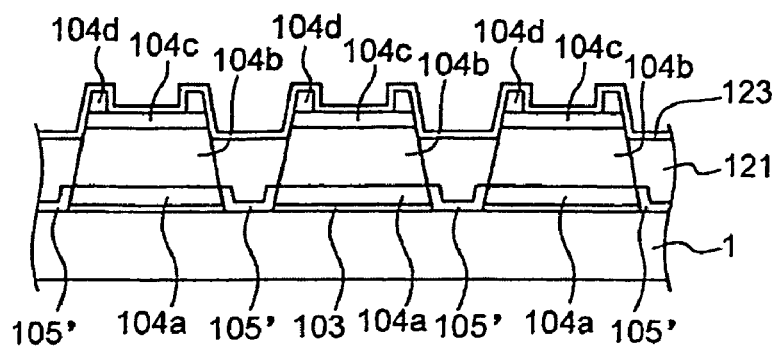
FIG. 12 (a) to (d) are cross sectional views following FIG. 11 (d) showing manufacturing processes of the semiconductor power device element.
Figure 12:
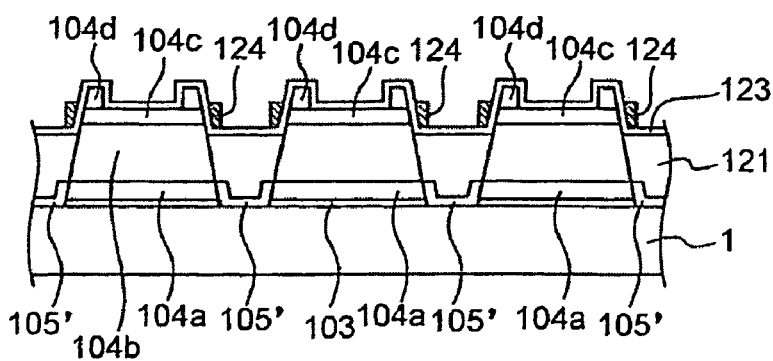
Figure 12:
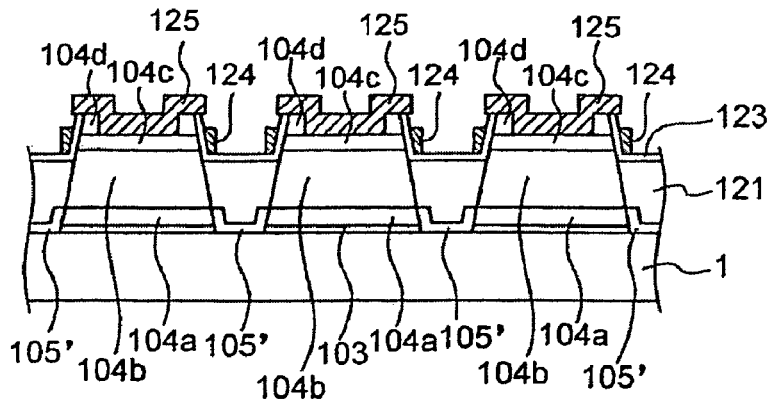
Figure 12:
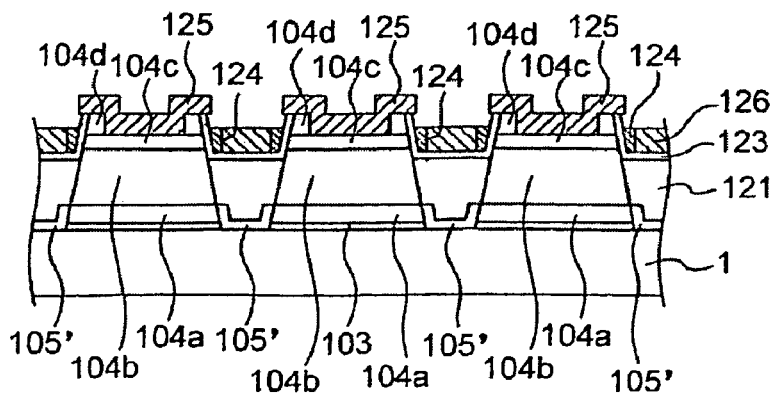
Figure 13:
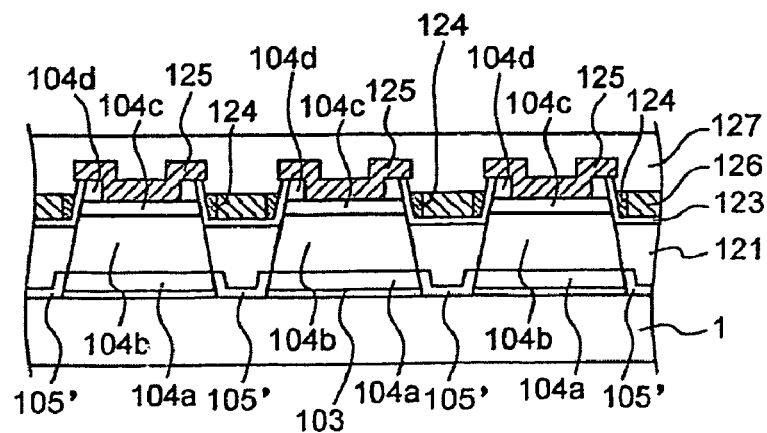
FIG. 13 (a) to (d) are cross sectional views following FIG. 12 (d) showing manufacturing processes of the semiconductor power device element.
Figure 13:
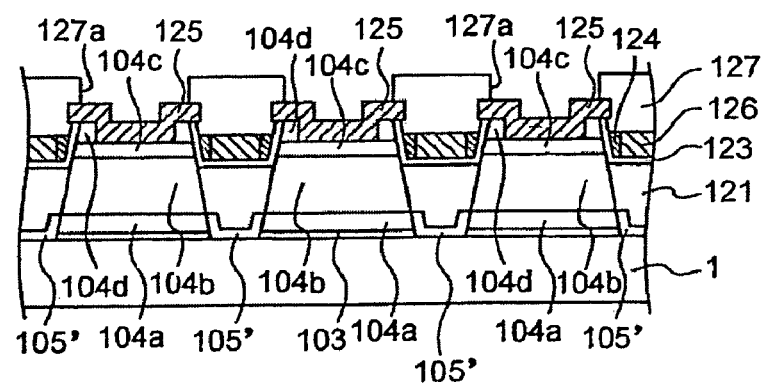
Figure 13:
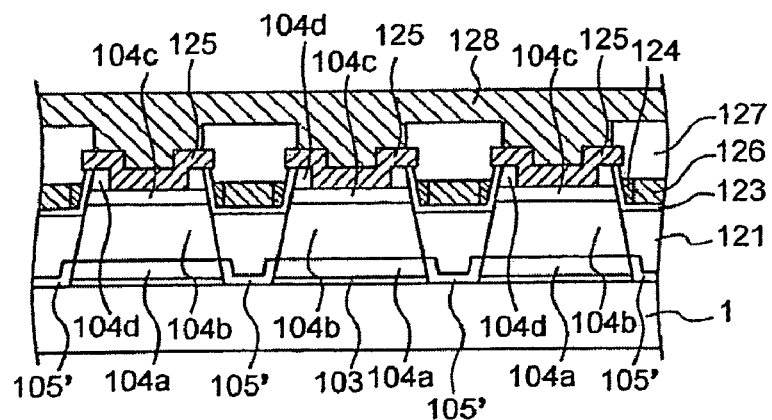
Figure 13:
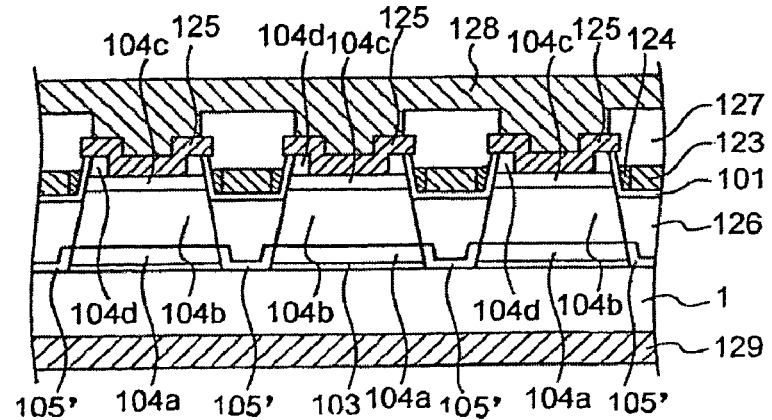

FIG. 11 to FIG. 13 are cross sectional views showing manufacturing processes of a vertical power MOSFET as a semiconductor element regarding the fourth embodiment of the present invention. Here, in FIG. 11 to FIG. 13, a symbol similar to that in FIG. 9 and FIG. 10 shows the similar element.

In FIG. 11 (a), on the silicon substrate 1, using the mask 2 for selective growth, an $n^+$-type GaN layer 104a of a thickness of approximately 1 μm, an $n^-$-type GaN layer 104b of a thickness of approximately 9 μm, a p-type GaN layer 104c, and another $n^+$-type GaN layer 104d are formed, to grow selectively to be as convex shape at plural parts thereon. Regarding the $n^+$-type GaN layer 104a, the Si is doped with a density of $5 \times 10^{18}$ $cm^{-3}$ therein. Moreover, regarding the $n^-$-type GaN layer 104b, the Si is doped with a density of $1 \times 10^{16}$ $cm^{-3}$ therein. Furthermore, regarding the p-type GaN layer 104c, the magnesium (Mg) is doped with a density of $5 \times 10^{16}$ $cm^{-3}$ therein. And then regarding the another $n^+$-type GaN layer 104d, the Si is doped with a density of $3 \times 10^{18}$ $cm^{-3}$ therein.

Regarding the selective growth method, as similar to the third embodiment, on the surface of the $n^-$-type GaN layer 104b, not only on an upper surface but also on a side surface thereof, the p-type GaN layer 104c and the $n^+$-type GaN layer 104d are grown. And then the p-type GaN layer 104c and the $n^+$-type GaN layer 104d on the side surface are removed by etching using a mask.

Next, as shown in FIG. 11 (b), similar to the third embodiment, the mask 2 for selective growth is removed, and then the bypass electrode 105' is formed. Moreover, on the silicon substrate 1, a part between each convex part, which comprises the $n^+$-type GaN layer 104a, the $n^-$-type GaN layer 104b, the p-type GaN layer 104c and the $n^+$-type GaN layer 104d, is filled with a first insulator film layer 121 of $SiO_2$. The first insulator film layer 121 of $SiO_2$ is grown, for example, using either forming method by the plasma CVD with the TEOS and the $O_2$ as the source gases, or by the plasma CVD with the TEOS and the $O_3$ as the source gases. And then for obtaining approximately similar height of a top part of the $n^+$-type GaN layer 104d, the first insulator film layer 121 is polished to be flattened using the CMP method.

Moreover, onto the first insulator film layer 121 and the $n^+$-type GaN layer 104d, a second insulator film layer 122 is formed to be a thickness of approximately 100 nm. And then using the photolithography method and using the buffered hydrofluoric acid, with fitting the upper surface shape of the $n^+$-type GaN layer 104d, such as a circle shape, a square shape, or the like, a hole pattern 122a is formed with a similar center to that of the upper surface. In the case of adopting the circle pattern with approximately 40 μm diameter, the circular hole pattern 122a is to be opened as approximately 30 μm diameter. Moreover, in the case of adopting the square pattern of approximately 40 μm on a side therefor, the square hole pattern 22 is to be opened as approximately 30 μm on a side.

After removing the resist, as shown in FIG. 11 (c), using the second insulator film layer 122 as a mask, the $n^+$-type GaN layer 104d is etched using the chlorine based ICP-RIE method, and then the upper surface of the p-type GaN layer 104c is exposed. Regarding the etching conditions, it is set to be as, for example, an ICP power of approximately 170 W, a bias power of approximately 50 W, a chlorine flow rate of approximately 7 sccm, a pressure of approximately 80 Pa, and a substrate temperature of approximately 50° C.

Next, as shown in FIG. 11 (d), the first insulator film layer 121 of $SiO_2$ and the second insulator film layer 122 of $SiO_2$ are etched until approximately 500 nm deeper than the depth of which a side of the p-type GaN layer 104d being exposed thereby.

Next, as shown in FIG. 12 (a), a gate oxide film layer 123 of $SiO_2$ is deposited to be as a thickness of approximately 50 nm. Regarding the deposition method, such as the PCVD, the thermal CVD, or the like, may be used. Regarding the source gas, the combination of the $SiH_4$ and the $N_2O$, or the TEOS combined with the $O_2$ or with the $O_3$, may be used.

Next, as shown in FIG. 12 (b), using the lift-off method, on a side surface of the p-type GaN layer 104c, a gate electrode 124 is formed through the gate oxide film layer 123.

Moreover, as shown in FIG. 12 (c), for the gate oxide film layer 123, areas for ohmic contacting are etched from a top part of the $n^+$-type GaN layer 104d and on the p-type GaN layer 104c. During the etching thereof, other areas are surrounded by a resist pattern (not shown). Moreover, using the lift-off method, for ohmic contacting with each top part of the $n^+$-type GaN layer 104d and the p-type GaN layer 104c, a source electrode 125 is formed. Regarding the source electrode 125, a Ti (30 nm)/Al (500 nm) layered structure is to be adopted.

Next, as shown in FIG. 12 (d), for connecting with each of a plurality of gate electrodes 124, a first wire 126 of aluminum is formed on the insulator film layer 121.

Next, as shown in FIG. 13 (a), for surrounding plural parts of the gate electrode 124, the first wire 126 and the source electrode 125, a third insulator film layer 127 is formed. Regarding the third insulator film layer 127, for example, using the method similar to the first insulator film layer 121, the $SiO_2$ film is to be grown.

Moreover, as shown in FIG. 13 (b), using the photolithography with the photoresist and the buffered hydrofluoric acid, the third insulator film layer 127 is patterned. And then an open part 127a is formed, for exposing a plurality of upper surfaces of the source electrode 125.

Next, as shown in FIG. 13 (c), inside the open part 127a and on the third insulator film layer 127, for connecting with each source electrode 125, a second wire 128 is formed.

After the above mentioned processes, as shown in FIG. 13 (d), on the rear surface of the Si substrate 1, a drain electrode 129 is formed, which comprises a layered structure of Ti(20 nm)/Ni(700 nm)/Au(20 nm).

Regarding the above structured vertical power MOSFET, at the time of applying a predetermined voltage onto the gate electrode 124, the depletion layer and the inversion layer are formed in the p-type GaN layer 104c. Moreover, through the inversion layer, the carrier in the n+-type GaN layer 104d is moved toward the n+-type GaN layer 104a and the n−-type GaN layer 104b. Furthermore, through the bypass electrode 105', it is moved to the silicon substrate 1 and then to the drain electrode 129. Thus, through the bypass electrode 105', the current is flowed between the source and the drain.

Regarding such the power MOSFET, as similar to the third embodiment, the bypass electrode 105' exists, and then the on-resistance becomes possible to be reduced thereby. Moreover, the n-type GaN layer 104 is formed as sufficiently thick, and then the breakdown voltage of approximately 1200 (v) is able to be obtained thereby.

Regarding the third and the fourth embodiment, it is described as an example that the carrier layer is to be as the nitride compound semiconductor layer, which is selectively grown as convex shape on the electro-conductive substrate. Moreover, in the case of a semiconductor element, which comprises a nitride compound semiconductor layer formed on a substrate with exposing at least one part of the surface of the electro-conductive substrate, the present invention is possible to be applied. For example, onto the all over the substrate, the buffer layer and then the nitride compound semiconductor layer are formed to be laminated. And then for exposing one part of the substrate, the buffer layer and the nitride compound semiconductor layer are etched. Moreover, a bypass part may be formed, which connects electrically with at least one part of the nitride compound semiconductor layer formed thereby, and with at least one part of the exposed areas on the surface of the substrate. And then at least some amount of the current becomes flowing therethrough. Thus, a vertical semiconductor element having a low on-resistance is able to be obtained.

Moreover, regarding the third and the fourth embodiment, instead of the GaN layers, other nitride compound group III-V semiconductor layers may be formed. Moreover, regarding the element formed in the nitride compound group III-V semiconductor layer, a heterojunction FET may be used. Furthermore, for the substrate, a SiC substrate may be used.

The Fifth Embodiment

Figure 14:
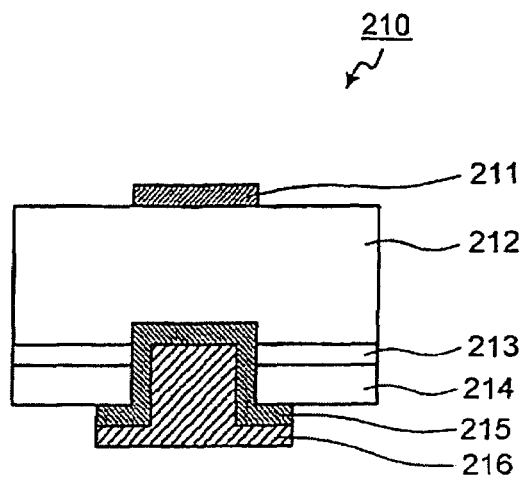
FIG. 14 is a cross sectional view showing a Schottky barrier diode as a vertical semiconductor element according to the fifth embodiment of the present invention.

As shown in FIG. 14, for a Schottky barrier diode 210 as a vertical semiconductor element regarding the fifth embodiment, on a Si substrate 214, an AlN buffer layer 213 of AlN is formed. And then through the AlN buffer layer 213, GaN drift layer 212 of GaN is formed. Regarding the GaN drift layer 212, for example, the thickness is approximately 500 nm, and as an n-type impurity, the Si with an additive amount of $1 \times 10^{16}$ cm$^{-3}$ is added. Moreover, the Schottky barrier diode 210 comprises a Schottky electrode 211, for Schottky barrier contacting with the surface of the GaN drift layer 212 on one face side of the Si substrate 214. Furthermore, the Schottky electrode 211 is formed using metal materials, for example, including such as a nickel (Ni), a gold (Au), and the like.

Regarding the Schottky barrier diode 210, a via is formed directly under the Schottky electrode 211, so as to extend from a rear surface of the Si substrate 214, through the AlN buffer layer 213, to the GaN drift layer 212. Moreover, using the via to contact with the GaN drift layer 212, an ohmic electrode 215 is formed on the rear surface of the Si substrate 214. The ohmic electrode 215 is formed using metal materials, for example, including such as a titanium (Ti), the gold (Au), and the like. Furthermore, the Schottky barrier diode 210 comprises a plate layer 216, which is formed on the surface of the ohmic electrode 215 for filling in the via. The plate layer 216 is plated using a high thermal conductive metal, such as a copper for example, and then the via is completely filled in thereby.

Figure 15:
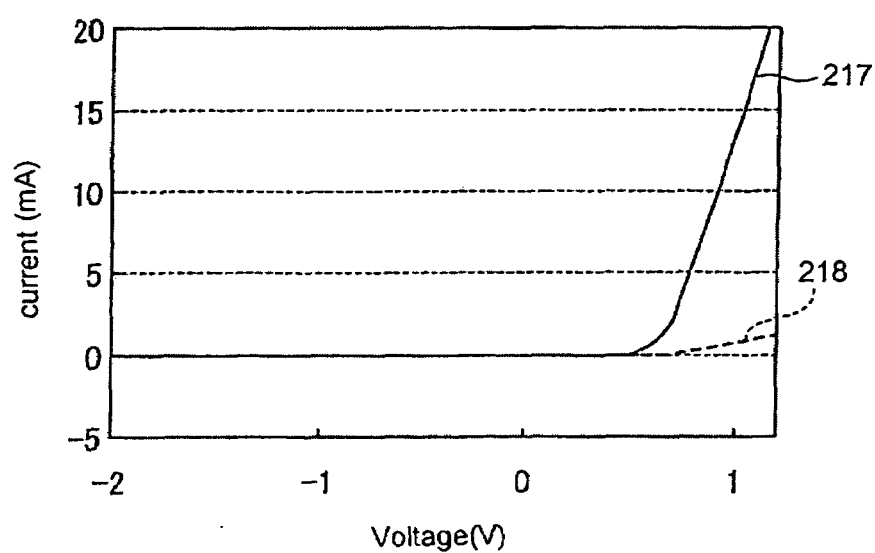
FIG. 15 is a graph showing the relationship between a forward applied voltage and a forward current in the Schottky barrier diode shown in FIG. 14.
Figure 21:
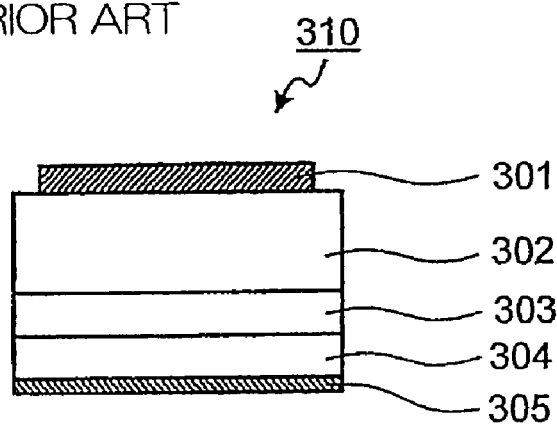
FIG. 21 is a cross sectional views of a Schottky barrier diode according to a conventional technology.
Figure 22:
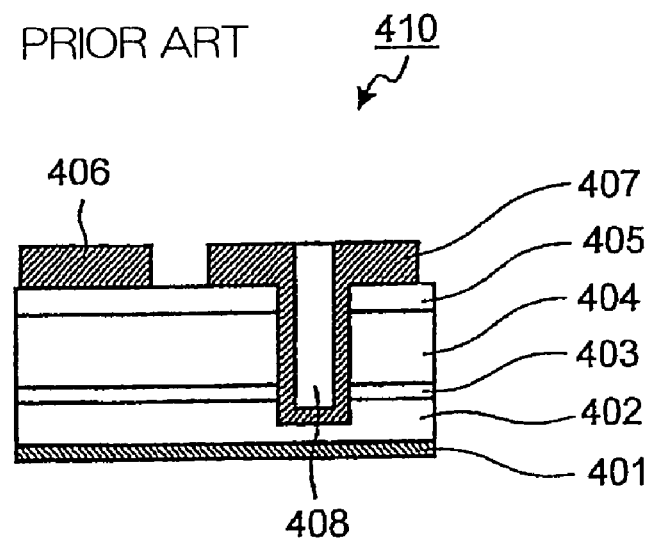
FIG. 22 is a cross sectional views of a Schottky barrier diode according to a conventional technology.

Next, a characteristic of the Schottky barrier diode 210 is described below. FIG. 15 is a graph showing the relationship between a forward applied voltage and a forward current regarding the Schottky barrier diode 210. A curve 217 corresponds to the Schottky barrier diode 210 of the present embodiment, and a dashed curve 218 corresponds to the conventional Schottky barrier diode 310 shown in FIG. 21.

As shown by the dashed curve 218 in FIG. 15, regarding the conventional Schottky barrier diode 310, even in the case of applying a voltage of 1 (V), almost no forward current is flowed, as the high on-resistance is indicated. Hence, for flowing a desired forward current, the applied voltage is necessary to be increased.

On the contrary, as shown by the curve 217 in FIG. 15, for the Schottky barrier diode 210 according to the present embodiment, when approximately 0.5 (V) voltage is applied, the forward current starts to be flowed. Moreover, regarding the Schottky barrier diode 210, in the case of applying the voltage of 1 (V), the forward current is able to be flowed, which is large as 20 (mA) or more. And then comparing to the conventional Schottky barrier diode 310, the forward current of ten times or more becomes possible to be obtained.

Thus, for the Schottky barrier diode 210 regarding the fifth embodiment, on the via, which is from the rear surface of the Si substrate 214, through the AlN buffer layer 213, reaches to the GaN drift layer 212, the ohmic electrode 215 is formed. Therefore, regarding the Schottky barrier diode 210, without passing through the AlN buffer layer 213 which includes a plurality of defects and having a high resistance, the Schottky electrode 211 and the ohmic electrode 215 are able to be connected electrically. Hence, toward the vertical direction in FIG. 14, sufficient amount of the current becomes possible to be flowed. And then comparing to conventional technologies, the on-resistance becomes possible to be lowered. In particular, regarding the Schottky barrier diode 210, at the part directly under the Schottky electrode 211, the via and then the ohmic electrode 215 are formed. Hence, inside the GaN drift layer 212, a path of electrons passing can be shortened. And then the forward current becomes able to be increased. Moreover, the on-resistance becomes able to be reduced.

Furthermore, regarding the Schottky barrier diode 210, in the case of a reverse bias being applied, as similar to the Schottky barrier diode 310 regarding the conventional technology, the depletion layer is able to be expanded in the GaN drift layer 212. Therefore, the high breakdown voltage is possible to be maintained as well.

Moreover, regarding the Schottky barrier diode 210, different from the Schottky barrier diode 410 regarding the conventional technology, the ohmic electrode is not necessary to be formed on the similar surface of the Schottky electrode 211. Therefore, a small chip size is possible to be maintained.

Furthermore, for the Schottky barrier diode 210 regarding the present embodiment, the plate layer 216 is formed, and then the via is filled with the high thermal conductive metal. Therefore, regarding the Schottky barrier diode, a heat dissipation becomes possible to be improved. And then the Schottky barrier diode having more excellent properties becomes possible to be realized.

Next, a manufacturing method for the Schottky barrier diode 210 regarding the fifth embodiment is described below.

Figure 16:
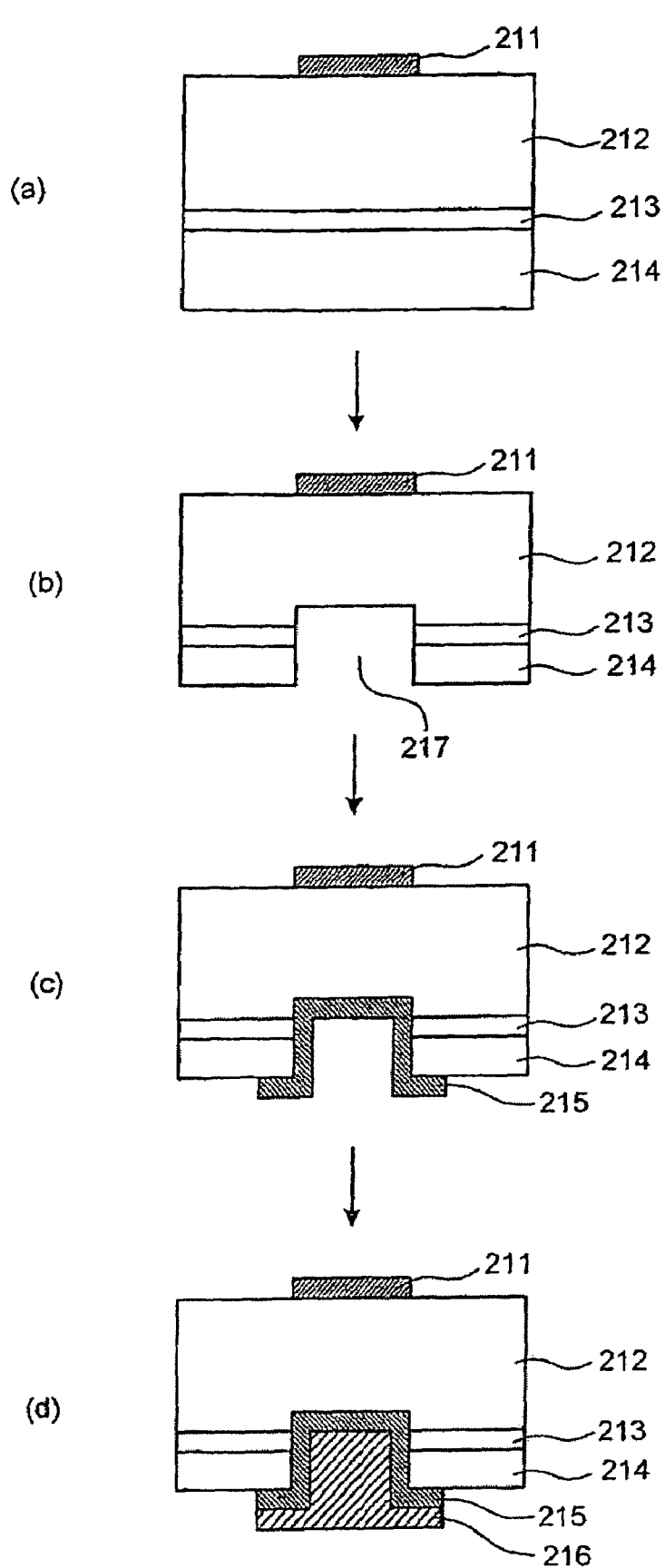
FIG. 16 (a) to (d) are cross sectional views showing a method of manufacturing the Schottky barrier diode shown in FIG. 14.

FIG. 16 (a) to (d) are cross sectional views showing manufacturing method for the Schottky barrier diode 210 shown in FIG. 14. Here, for the Schottky barrier diode 210 regarding the present embodiment, the conventional manufacturing technologies for semiconductor elements using the Si substrates are possible to be used without modifying.

First, as shown in FIG. 16 (a), onto the Si substrate, using the metalorganic chemical vapor deposition (MOCVD) method for example, the AlN buffer layer 213 of AlN is formed, and then the GaN drift layer 212 of GaN semiconductor is formed thereon. Regarding the deposition of the AlN buffer layer 213, the trimethylaluminum is used as the source gas. Regarding the deposition of the GaN drift layer 212, the trimethylgallium and the ammonia are used as the source gases. Moreover, for adding the Si as the n-type impurity into the GaN drift layer 212, the silane gas is used. Furthermore, onto the GaN drift layer 212, metal materials including the Ni and/or the Au are evaporated using the spattering method. Moreover, by following the photolithography process and then the etching process, the Schottky electrode 211 is formed.

Next, onto the Schottky electrode 211 side of the Si substrate 214, a protective coat is formed. And then by mechanical polishing for the rear surface of the Si substrate 214, the Si substrate 214 is polished until a thickness of approximately 100 μm. Moreover, as shown in FIG. 16 (b), the photolithography process, and then a dry etching process using a fluorine sulfide plasma are performed onto the rear surface of the Si substrate 214. Thus, a via 217 is formed directly under the Schottky electrode 211. Regarding the via 217, from the Si substrate 214, through the AlN buffer layer 213, and then reaches to the GaN drift layer 212 as a depth thereof. Here, regarding the via 217, for avoiding an affect from an interface state between the GaN drift layer 212 and the AlN buffer layer 213, from the interface between the AlN buffer layer 213 and the GaN drift layer 212, it may be rather preferable to be formed deeper into the inside of the GaN drift layer 212.

Next, onto the rear surface of the Si substrate 214, the metal materials including the Ti and/or the Au are evaporated by spattering. Moreover, by following the photolithography process and then the etching process, the ohmic electrode 215 is formed. Furthermore, using a high thermal conductive metal, such as the copper or the like, the via 217 is completely filled in, and then the plate layer 216 is formed therewith. Thus, the Schottky barrier diode 210 is able to be manufactured thereby. Here, both of the Schottky electrode 211 and the ohmic electrode 215 are discoidal of approximately 100 μm diameter. Therefore, the chip area is small, and then it is useful for forming a small size power element. Regarding the above mentioned embodiment, only the AlN layer 213 is described, however, the structure of the buffer layers may be changed properly. For example, a buffer layer may be formed, in which the AlN layer and the GaN layer are staggered. Regarding such the structure of the buffer layer, for passing through at least the AlN layer as insulative, the via 217 may be formed.

The Sixth Embodiment

Figure 17:
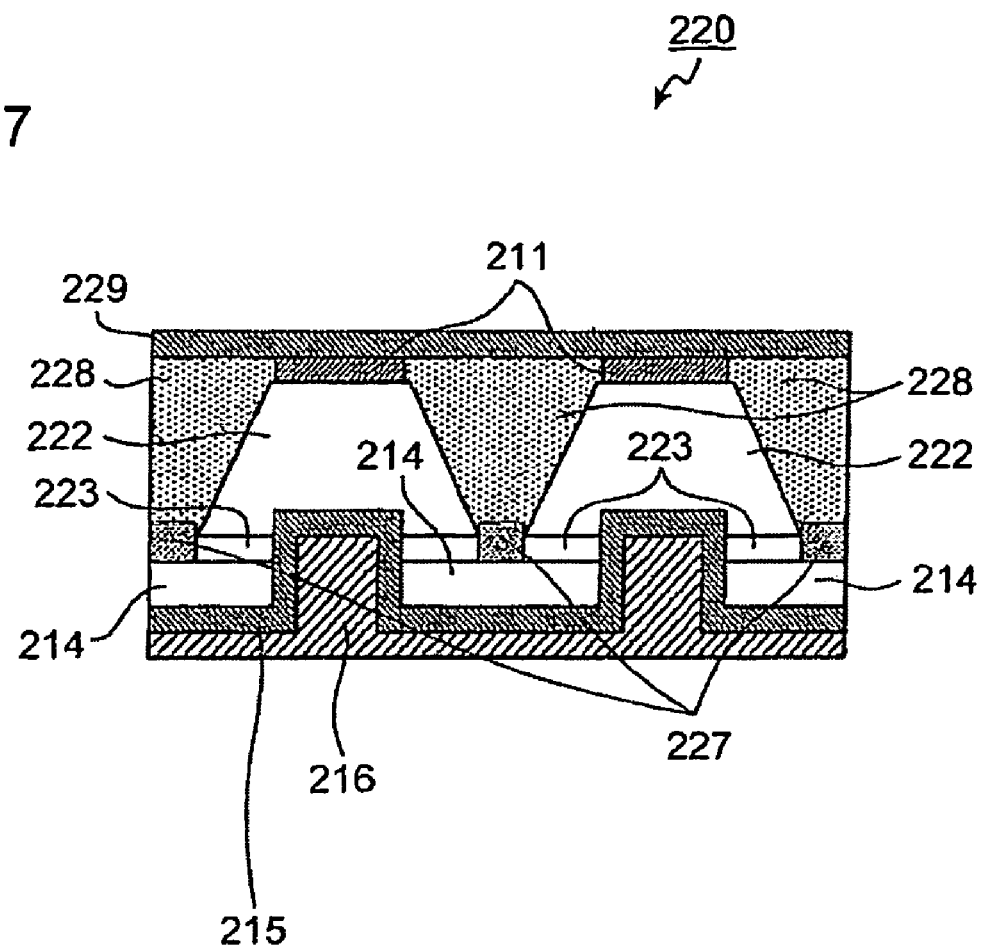
FIG. 17 is a cross sectional views of a Schottky barrier diode as a vertical semiconductor element according to the sixth embodiment of the present invention.

Next is a description regarding the sixth embodiment. As shown in FIG. 17, regarding a Schottky barrier diode 220 as a vertical semiconductor element regarding the sixth embodiment, for forming a GaN drift layer 222 of GaN as thicker, the GaN drift layer is formed using the selective growth method.

Regarding the Schottky barrier diode 220, on the Si substrate 214, a mask 227 for selective growth is formed as a grid pattern. And then on other areas except the mask 227 for selective growth patterned area, an AlN buffer layer 223, which functions similar to the AlN buffer layer 213 shown in FIG. 14, and a GaN drift layer 222, which functions similar to the GaN drift layer 212 shown in FIG. 14, are formed. Regarding the mask 227 for selective growth, for example, with spacing approximately 10 μm, a square open part of approximately 40 μm on a side is formed to be arrayed. Hence, in the case of viewing from the upper side of the Si substrate 214, onto each area of the Si substrate 214, which is exposed from each open part of the mask 227 for selective growth, the square shape AlN buffer layer 223 and the GaN drift layer 222 are grown respectively.

Regarding the Schottky barrier diode 220, on each GaN drift layer 222, there is provided a Schottky electrode 211 respectively. Moreover, regarding the Schottky barrier diode 220, for connecting with a plurality of the Schottky electrodes 211, there is provided an upper wiring electrode 229. Furthermore, directly under each Schottky electrode 211, from the rear surface of the Si substrate 214 through the AlN buffer layer 223 to the GaN drift layer 222, there is provided a via. And then using the via to contact with the GaN drift layer 222, the ohmic electrode 215 is formed. Moreover, onto the ohmic electrode 215, the plate layer 216 is formed.

Here, as the Schottky barrier diode regarding the fifth embodiment shown in FIG. 14, in the case of forming the AlN buffer layer and the GaN drift layer uniformly onto the Si substrate 214, the film area becomes large, and then the whole film is strained. Hence, in the AlN buffer layer and the GaN drift layer, a crack cannot help but be occurred. Therefore, in the case of forming the AlN buffer layer and the GaN drift layer uniformly onto the Si substrate 214, the GaN layer is not able to be formed as thick as approximately 0.5 μm or more. Thus, by forming the GaN layer as thick, the high breakdown voltage of the Schottky barrier diode is sometimes hard to be designed.

On the contrary, regarding the Schottky barrier diode 220 shown in FIG. 17, there is provided the mask 227 for selective growth to grow selectively the AlN buffer layer 223 and the GaN drift layer 222 on areas without the mask 227 for selective growth. That is to say, on the Si substrate 214, the AlN buffer layer 223 and the GaN drift layer 222 are not formed all over thereon. Therefore, regarding the Schottky barrier diode 220, the film areas of the AlN buffer layer 223 and the GaN drift layer 222 are able to be smaller. And then the crack, which is occurred due to the large film area, becomes possible to be avoided.

As a result, regarding the Schottky barrier diode 220, comparing to the Schottky barrier diode 210, the thickness of the GaN drift layer 222 is able to be thicker. And then the higher breakdown voltage of the Schottky barrier diode due to the thicker GaN drift layer becomes possible to be realized. To be specific, regarding the Schottky barrier diode 220, the GaN drift layer 222 becomes possible to be thick as the film thickness of approximately 5 μm, from the film thickness of approximately 0.5 μm for the Schottky barrier diode 210 according to the fifth embodiment. As a result, regarding the Schottky barrier diode 220, the breakdown voltage at the time of applying the reverse bias becomes able to be high as approximately 500 (V) or more, from approximately 100 (V) for the Schottky barrier diode 210.

Moreover, regarding the sixth embodiment, a plurality of the Schottky electrodes 211 are connected by the upper wiring electrode 229. And then, a plurality of the Schottky barrier diodes 220 become possible to be connected. Therefore, regarding the sixth embodiment, corresponding to the number of the Schottky barrier diodes connected by the upper wiring electrode 229, increasing of the forward current is possible to be controlled. Moreover, by increasing and decreasing the number of the Schottky barrier diodes connected by the upper wiring electrode 229, the Schottky barrier diode having the desired chip size is possible to be obtained. And then it is further useful for forming a small size power element.

Furthermore, regarding the sixth embodiment, as similar to the fifth embodiment, the ohmic electrode 215 is formed on the via, which is from the rear surface of the Si substrate 214, through the AlN buffer layer 223, and reaches to the GaN drift layer 222. Therefore, comparing to the Schottky barrier diode according to the conventional technology in which it is formed directly on the silicon substrate without providing any via, the forward current becomes possible to be increased ten times or more.

Figure 18:
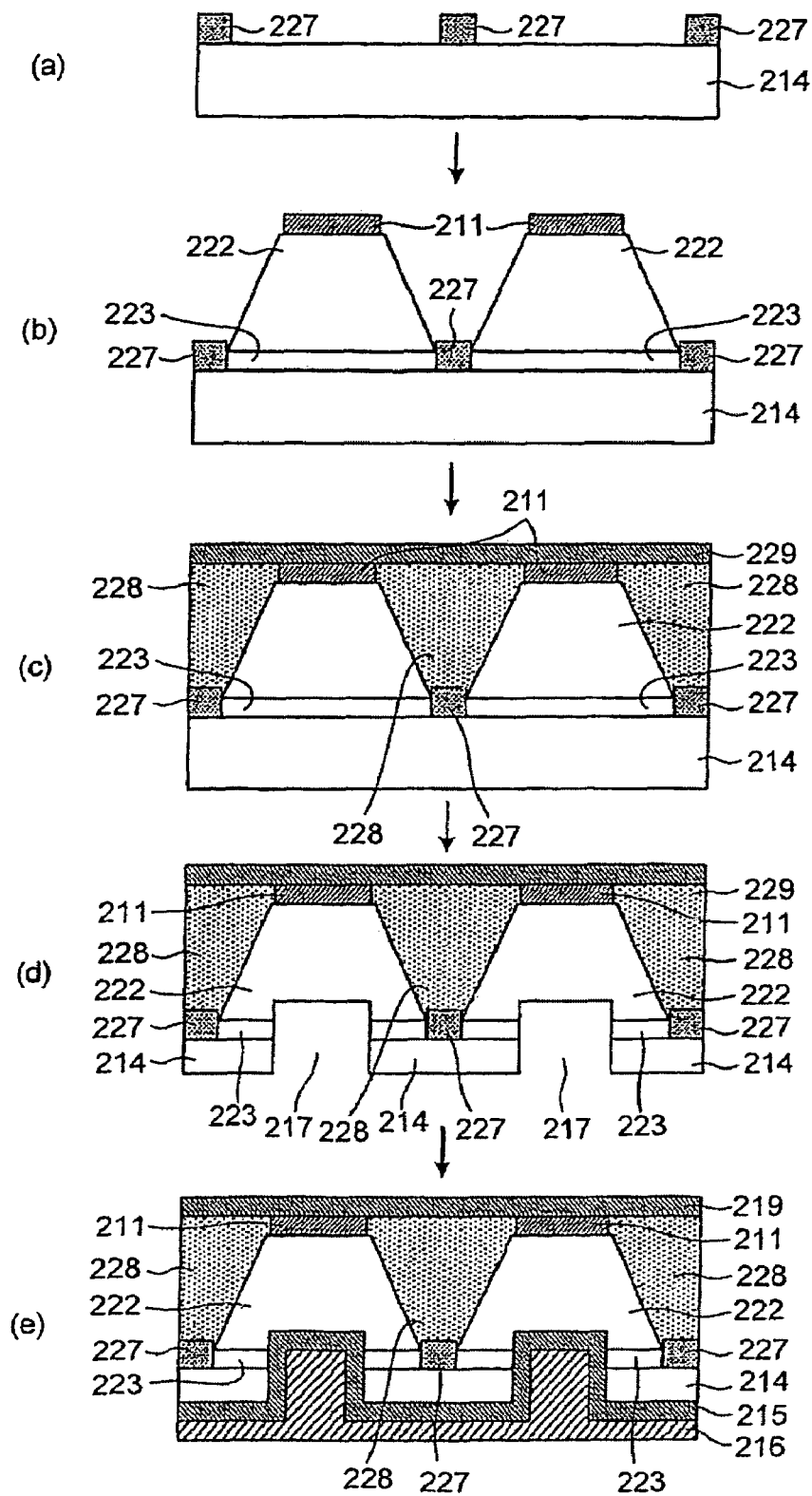
FIG. 18 (a) to (e) are cross sectional views showing a method of manufacturing the Schottky barrier diode shown in FIG. 17.

Next is a description regarding a manufacturing method for the Schottky barrier diode 220 according to the sixth embodiment. FIG. 18 (a) to (e) are the cross sectional views showing manufacturing method for the Schottky barrier diode 220 shown in FIG. 17.

First, onto the Si substrate 214, using the plasma chemical vapor deposition (PCVD) method, $SiN_x$ film or $SiO_2$ film is deposited to be as a thickness of approximately 100 nm. Regarding the etching process for dielectric substances, the RIE etching using the $CF_4$ gas is performed on the $SiN_x$ film layer, or the buffered hydrofluoric acid etching is performed on the $SiO_2$ film layer. Moreover, as shown in FIG. 18 (a), by following the photolithography process and then the etching process for the dielectric substances, a mask 227 for selective growth is formed, with spacing 10 μm approximately and having a square open part of approximately 40 μm on a side.

Next, as shown in FIG. 18 (b), similar to the case shown in FIG. 16 (a), the AlN buffer layer 223 of AlN is formed, and then the GaN drift layer 222 of GaN semiconductor is formed thereon. In this case, a thickness of approximately 5 μm of the GaN drift layer 222 is formed. Moreover, for the GaN drift layer 222, the Si as the adding amount of $1\times10^{16}$ cm$^{-3}$ is added as the n-type impurity. Furthermore, onto the GaN drift layer 222, the metal materials including the Ni and/or the Au are evaporated using the spattering method. Moreover, by following the photolithography process and then the etching process, the Schottky electrode 211 is formed, which is a square shape of approximately 20 μm on a side for example.

Next, using the PCVD method, an insulator film of $SiO_2$ is deposited, and then the GaN drift layer 222 is implanted inside the insulator film. Moreover, by flattening the insulator film surface using the chemical mechanical polishing (CMP) method, the implanting insulator film 228 is implanted between each GaN drift layer 222. Furthermore, by following the photolithography process and then the etching process, only the insulator film on the Schottky electrode 211 is removed. And then as shown in FIG. 18 (c), onto the Schottky electrode 211 and the GaN drift layer 222, using the vacuum deposition method, the upper electrode 229 is formed. Thus, a plurality of neighboring Schottky electrodes 211 are connected by the upper electrode 229. That is to say, a plurality of the Schottky barrier diode becomes possible to be electrically connected thereby.

Next, similar to the fifth embodiment, as shown in FIG. 18 (d), onto the Schottky electrode 211 side of the Si substrate 214, a protective coat is formed. And then by mechanical polishing for the rear surface of the Si substrate 214, the Si substrate 214 is polished until a thickness of approximately 100 μm. Moreover, the photolithography process and then the etching process are performed onto the rear surface of the Si substrate 214. Thus, the via 217 is formed directly under each Schottky electrode 211. Regarding the via 217, from the Si substrate 214, through the AlN buffer layer 223, and then reaches to the GaN drift layer 222 as a depth thereof. Here, regarding the via 217, as similar to the fifth embodiment, from the interface between the AlN buffer layer 223 and the GaN drift layer 222, it may be rather preferable to be formed deeper into the inside of the GaN drift layer 222.

Next, as shown in FIG. 18 (e), similar to the fifth embodiment, onto the rear surface of the Si substrate 214, the ohmic electrode 215 is formed. Furthermore, using a high thermal conductive metal, such as the copper or the like, the via 217 is completely filled in, and then the plate layer 216 is formed therewith. Thus, the Schottky barrier diode 220 becomes able to be manufactured thereby.

The Seventh Embodiment

Figure 19:
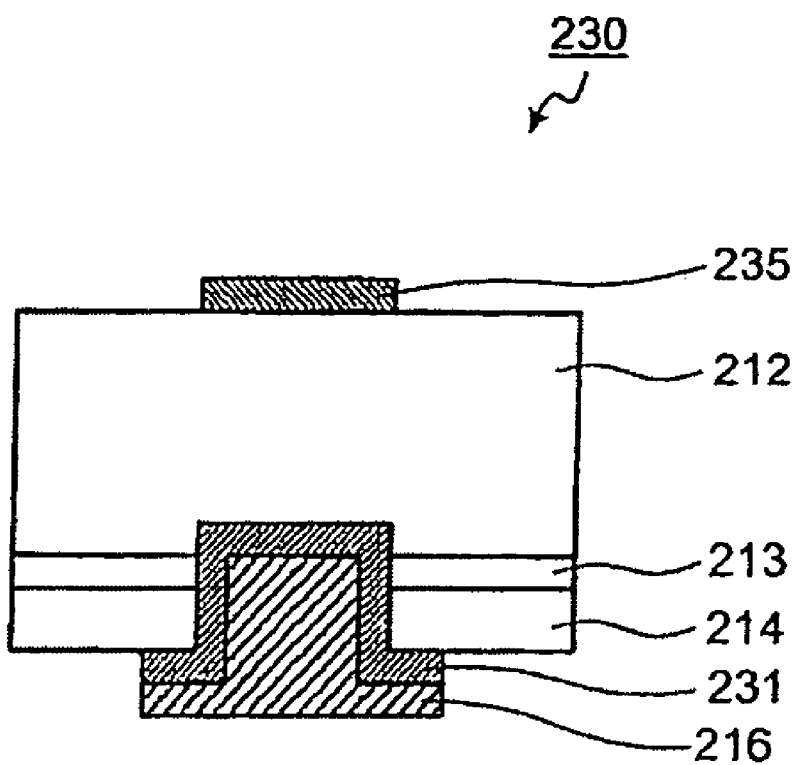
FIG. 19 is a cross sectional views of a Schottky barrier diode as a vertical semiconductor element according to the seventh embodiment of the present invention.

Next is a description regarding the seventh embodiment. As shown in FIG. 19, in a Schottky barrier diode 230 as the vertical semiconductor element regarding the seventh embodiment, the electrode arrangement is reversed from that of the Schottky barrier diode 210 shown in FIG. 14. That is to say, a Schottky barrier diode 231 is formed on the rear surface of the Si substrate 214. Moreover, an ohmic electrode 235 is formed on the GaN drift layer 212.

Here, a heat generation of a Schottky barrier diode is occurred mainly at the Schottky electrode side for Schottky contacting. Therefore, according to the seventh embodiment, the heat generating Schottky electrode 231 is provided at the rear surface side of the Si substrate 214 as an excellent heat dissipation side. Thus, the heat dissipation of the Schottky barrier diode is improved. And then an improvement of the temperature characteristic becomes able to be realized thereof.

Figure 20:
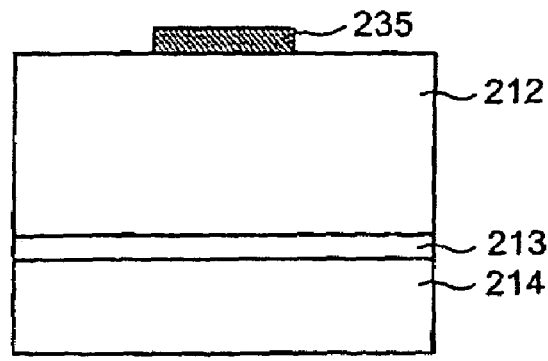
FIG. 20 (a) to (c) are cross sectional views showing a method of manufacturing method for the Schottky barrier diode shown in FIG. 19.
Figure 20:
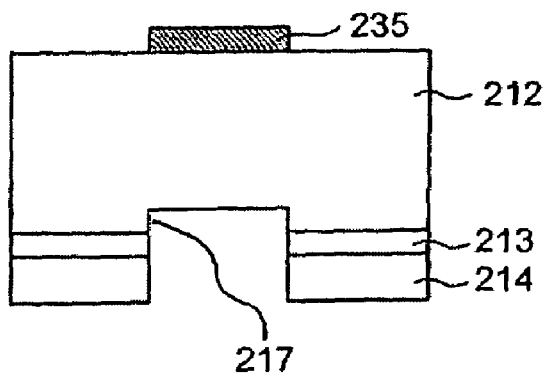
Figure 20:
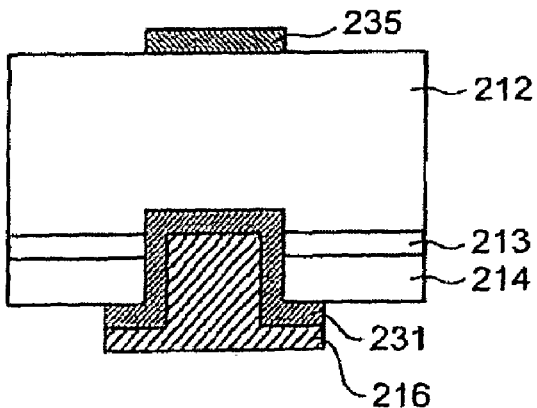

Next is a description regarding a manufacturing method for the Schottky barrier diode 230 according to the seventh embodiment. FIG. 20 (a) to (c) are cross sectional views showing manufacturing method for the Schottky barrier diode 230 shown in FIG. 19. As shown in FIG. 20 (a), similar to the fifth embodiment, using the MOCVD method, the AlN buffer layer 213 is formed, and then the GaN drift layer 212 is formed thereon. Moreover, onto the GaN drift layer 212, the metal materials including the Ni and/or the Au are evaporated using the spattering method. Furthermore, by following the photolithography process and then the etching process, the ohmic electrode 235 is formed.

Next, as shown in FIG. 20 (b), similar to the fifth embodiment, onto the ohmic electrode 235 side of the Si substrate 214, a protective coat is formed. Moreover, after the rear surface of the Si substrate 214 is polished, the photolithography process and then the etching process are performed onto the rear surface of the Si substrate 214. Thus, the via 217 is formed directly under each ohmic electrode 235.

Next, as shown in FIG. 20 (c), onto the rear surface of the Si substrate 214, a Schottky electrode 231 is formed. Furthermore, using the high thermal conductive metal, such as the copper or the like, the via 217 is completely filled in, and then the plate layer 216 is formed therewith. Thus, the Schottky barrier diode 230 becomes able to be manufactured thereby.

Regarding the above mentioned fifth to the seventh embodiment, the cases using the Si substrate are described. However, it is not limited thereto; a sapphire substrate or a SiC substrate may also be used. Moreover, in the above mentioned fifth to the seventh embodiment, regarding the buffer layer, the cases using the AlN buffer layer 213 or 223 are described. However, it is not limited thereto; a multilayered film layers of such as AlN, GaN, and the like may also be used.

The present invention is not limited to the above described embodiments and various and modifications may be possible without departing from the scope of the present invention.

What is claimed is:

1. A vertical semiconductor element, comprising:
    an electro-conductive substrate;
    a buffer layer grown on one surface of the electro-conductive substrate;
    a nitride compound semiconductor layer which is selectively grown as a convex shape on the buffer layer;
    a first electrode formed on the nitride compound semiconductor layer; and
    a second electrode formed on another surface of the electro-conductive substrate, and in the one surface of the electro-conductive substrate, there is one part where the nitride compound semiconductor layer is formed and another part where the nitride compound semiconductor layer is not formed.

2. The vertical semiconductor element according to claim 1, further comprising:
    a bypass part which connects electrically the part of the one surface of the electro-conductive substrate where the nitride compound semiconductor layer is not formed, and at least one part of the nitride compound semiconductor layer.

3. The vertical semiconductor element according to claim 2,
    wherein said at least one part of the nitride compound semiconductor layer is a high density impurity doped layer and the bypass part connects electrically the part of the one surface of the electro-conductive substrate where the nitride compound semiconductor layer is not formed and the high density impurity doped layer.

4. The vertical semiconductor element according to claim 2,
    wherein the electro-conductive substrate comprises an n-type silicon substrate, the nitride compound semiconductor layer comprises an n-type GaN layer, the bypass part comprises a Ti layer and an Al layer formed on the Ti layer, and the bypass part connects the n-type GaN layer with the part of the one surface of the electro-conductive substrate where the nitride compound semiconductor layer is not formed.

5. The vertical semiconductor element according to claim 1,
    wherein a plurality of the nitride compound semiconductor layers formed on the one surface of the electro-conductive substrate are electrically connected by the first electrode.

6. The vertical semiconductor element according to claim 1,
    wherein the second electrode is formed on a via which passes from another surface of the electro-conductive substrate through the buffer layer to the nitride compound semiconductor layer.

7. The vertical semiconductor element according to claim 6,
    wherein one of the first electrode and the second electrode is a Schottky electrode, and another one is an ohmic electrode.

8. The vertical semiconductor element according to claim 6,
    wherein the electro-conductive substrate comprises an n-type silicon substrate, and the nitride compound semiconductor layer comprises an n-type GaN layer.

9. The vertical semiconductor element according to claim 6,
    wherein a plurality of the nitride compound semiconductor layers formed on the one surface of the electro-conductive substrate are electrically connected by the first electrode.

10. A manufacturing method for a vertical semiconductor element, comprising:
    a step for forming a buffer layer to grow on one surface of an electro-conductive substrate;
    a step for forming a plurality of convex shape nitride compound semiconductor layers to selectively grow on the buffer layer; and
    a step for forming a bypass part which connects electrically a part of the one surface of the electro-conductive substrate where the nitride compound semiconductor layer is not formed, and at least one part of the nitride compound semiconductor layer.

* * * * *